(12) United States Patent
Madduri et al.

(10) Patent No.: US 10,656,942 B2
(45) Date of Patent: *May 19, 2020

(54) FIXED POINT TO FLOATING POINT CONVERSION

(71) Applicant: Intel Corporation, Santa Clara, CA (US)

(72) Inventors: Venkateswara Madduri, Austin, TX (US); Elmoustapha Ould-Ahmed-Vall, Chandler, AZ (US); Robert Valentine, Kiryat Tivon (IL); Jesus Corbal, King City, OR (US); Mark Charney, Lexington, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/291,245

(22) Filed: Mar. 4, 2019

(65) Prior Publication Data
US 2019/0196818 A1 Jun. 27, 2019

Related U.S. Application Data

(63) Continuation of application No. 15/721,602, filed on Sep. 29, 2017, now Pat. No. 10,223,114.

(51) Int. Cl.
*G06F 5/00* (2006.01)
*G06F 9/30* (2018.01)
*G06F 7/483* (2006.01)
*H03M 7/24* (2006.01)

(52) U.S. Cl.
CPC .......... *G06F 9/30025* (2013.01); *G06F 7/483* (2013.01); *H03M 7/24* (2013.01)

(58) Field of Classification Search
None
See application file for complete search history.

(56) References Cited

U.S. PATENT DOCUMENTS

| 4,805,128 A | 2/1989 | Nelsen et al. |
| 5,561,615 A | 10/1996 | Kuo et al. |
| 7,216,138 B2 | 5/2007 | Abdallah et al. |

(Continued)

OTHER PUBLICATIONS

Notice of Allowance from U.S. Appl. No. 15/721,602, dated Oct. 17, 2018, 6 pages.

*Primary Examiner* — David H Malzahn
(74) *Attorney, Agent, or Firm* — Nicholson De Vos Webster & Elliott LLP

(57) ABSTRACT

Embodiments of instructions and methods of execution of said instructions and resources to execute said instructions are detailed. For example, in an embodiment, a processor comprising: decode circuitry to decode an instruction having fields for an opcode, a packed data source operand identifier, and a packed data destination operand identifier; and execution circuitry to execute the decoded instruction to convert a data element from a least significant packed data element position of the identified packed data source operand from a fixed-point representation to a floating point representation, store the floating point representation into a 32-bit least significant packed data element position of the identified packed data destination operand, and zero all remaining packed data elements of the identified packed data destination operand is described.

25 Claims, 28 Drawing Sheets

(56) References Cited

U.S. PATENT DOCUMENTS

| | | | |
|---|---|---|---|
| 10,223,114 B1 * | 3/2019 | Madduri | G06F 7/483 |
| 10,224,954 B1 * | 3/2019 | Madduri | H03M 7/24 |
| 2004/0128331 A1 | 7/2004 | Hinds et al. | |
| 2011/0153991 A1 | 6/2011 | Busaba et al. | |
| 2018/0052660 A1 | 2/2018 | Lutz et al. | |
| 2018/0157464 A1 | 6/2018 | Lutz et al. | |
| 2019/0196818 A1 * | 6/2019 | Madduri | G06F 7/483 |

* cited by examiner

```
// SRC[31:0] IS A 16-BIT OR A 32-BIT UNSIGNED OR SIGNED 2'S COMPLEMENT NUMBER
IF (TREATAS16BIT)
        IF (TREATASUNSIGNED)    INTEGER32VAL[31:0] ← {16'B0, SRC[15:0]};
        ELSE INTEGER32VAL[31:0] ← {{16{SRC[15]}}, SRC[15:0]};
ELSE    INTEGER32VAL[31:0] ← SRC[31:0];
IF (INTEGER32VAL[31:0] == 32'B0)
        SIGN    ← 1'B0; FRACTION   ← 23'B0; EXPONENT ←  8'B0;
ELSE
IF (TREATASUNSIGNED || (INTEGER32VAL[31] == 1'B0))
        SIGN                    ← 1'B0;
            ABSINTEGER32VAL[31:0] ← INTEGER32VAL[31:0];
        ELSE
            SIGN                ← 1'B1;
            ABSINTEGER32VAL[31:0] ← (~INTEGER32VAL[31:0]) + 1'B1;
        // FIND POSITION OF LEADING 1 SCANNING FROM MSB TO LSB [31:0] BITS.
LEADINGBIT[4:0] ← POSITION_OF_LEADING_1(ABSINTEGER32VAL[31:0]);
// CONSTRUCT FLOATING POINT REPRESENTATION
IF (LEADINGBIT[4:0] == 0)
        FRACTIONAL[22:0] ← 23'B0;
ELSE
        MSBPOS[4:0] ← (LEADINGBIT[4:0] - 1'B1);      // UNSIGNED POSITIVE NUMBER
        IF (LEADINGBIT[4:0] > 5'D23)
        // CAN ONLY PRESERVE 24-BITS OF PRECISION, LEADING 1 IMPLIED
        LSBPOS   ← LEADINGBIT[4:0] – 5'D23;    // A POSITIVE NUMBER
        FRACTIONAL[22:0] ← ABSINTEGER32VAL[MSBPOS:LSBPOS];
        ELSE
        PADDINGBITS  ← (5'D23 - LEADINGBIT[4:0]);   // A POSITIVE NUMBER
        FRACTIONAL[22:0] ← {ABSINTEGER32VAL[MSBPOS:0], (PADDINGBITS)'B0 };
        // UNSIGNED ADDITION WITH WRAPPING
        EXPONENT[7:0] ← 8'D127 + {3'B0, LEADINGBIT[4:0]};
DEST[31:0]    ← {SIGN, EXPONENT[7:0], FRACTIONAL[22:0]};
```

VEX PREFIX 1502

[C4] R X B M M M M M W V V V V L P P

- FORMAT FIELD 1590
- REX 1505
- OPCODE MAP 1515
- W FIELD 1564
- VVVV FIELD 1520
- SIZE FIELD 1568
- PREFIX ENCODING FIELD 1525

REAL OPCODE FIELD 1530

Y Y Y Y Y Y Y Y

MOD R/M 1540

SIB 1550

D 1562 (DISPLACEMENT FIELD)

IMM8 1572

MOD R/M BYTE

| 7 6 | 5 | 3 | 2 0 |
|---|---|---|---|
| MOD 1542 | REG 1544 | | R/M 1546 |

SIB BYTE

| 7 6 | 5 | 3 | 2 0 |
|---|---|---|---|
| SS 1552 | XXX 1554 | | BBB 1556 |

- FORMAT FIELD 1540
- PREFIX ENCODING FIELD 1525
- OPCODE MAP 1515
- DATA ELEMENT WIDTH FIELD 1564
- REAL OPCODE FIELD 1530
- BASE OPERATION FIELD 1541
- FULL OPCODE FIELD 1574

FIG. 15C

REX 1505: R X B

VVVV FIELD 1520: V V V V

REGISTER INDEX FIELD 1544

| REG 1544 | R/M 1546 | XXX 1554 | BBB 1556 |

FIG. 16
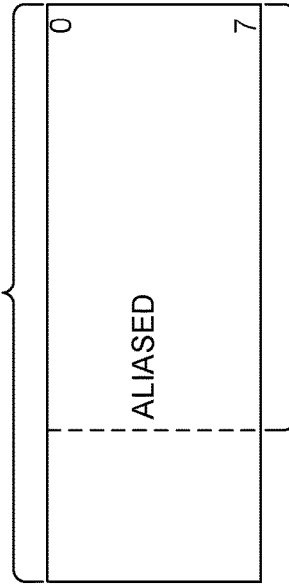
SCALAR FP STACK REGISTER FILE 1645 (X87FP) 80 BITS
ALIASED
64 BITS
MMX PACKED INT FLAT REGISTER FILE 1650
REGISTER ARCHITECTURE 1600
General Purpose Registers 1625
16 X 64 BITS
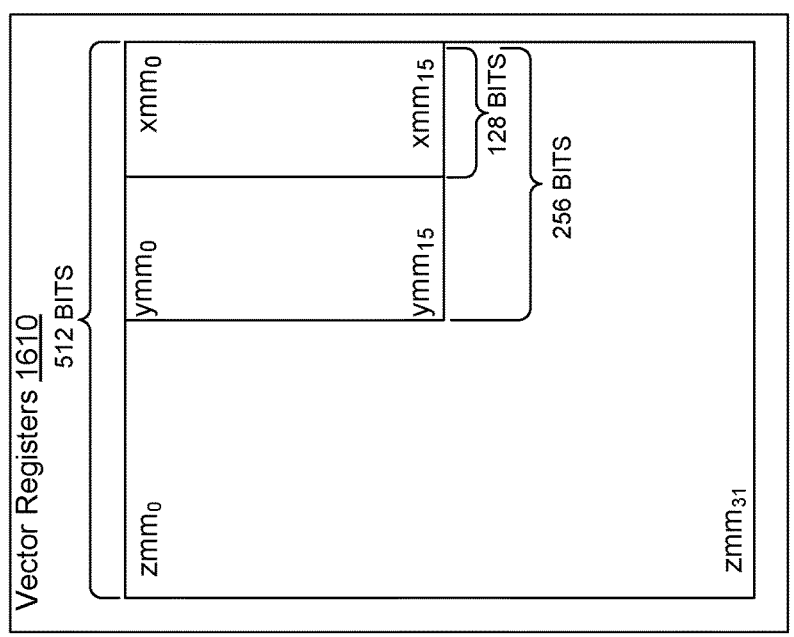
Vector Registers 1610
512 BITS
128 BITS
256 BITS

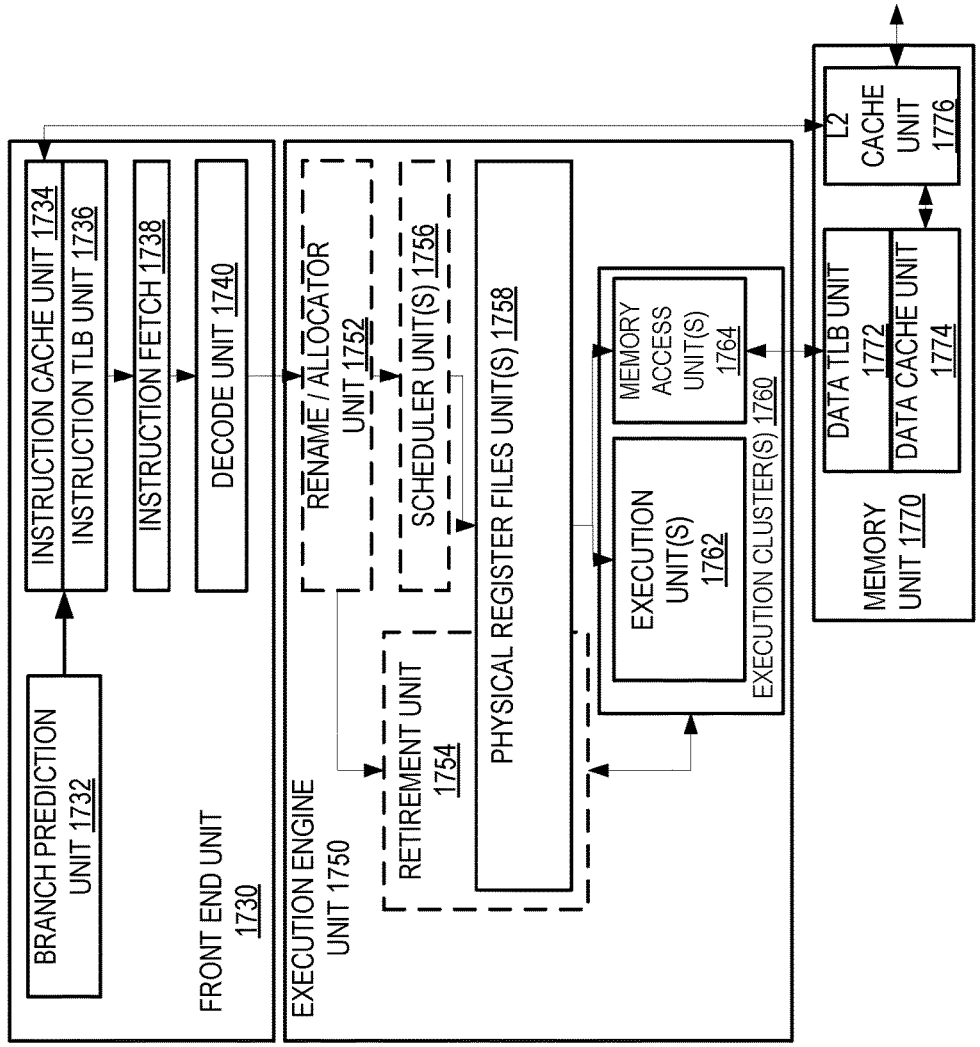
FIG. 17A
FIG. 17B

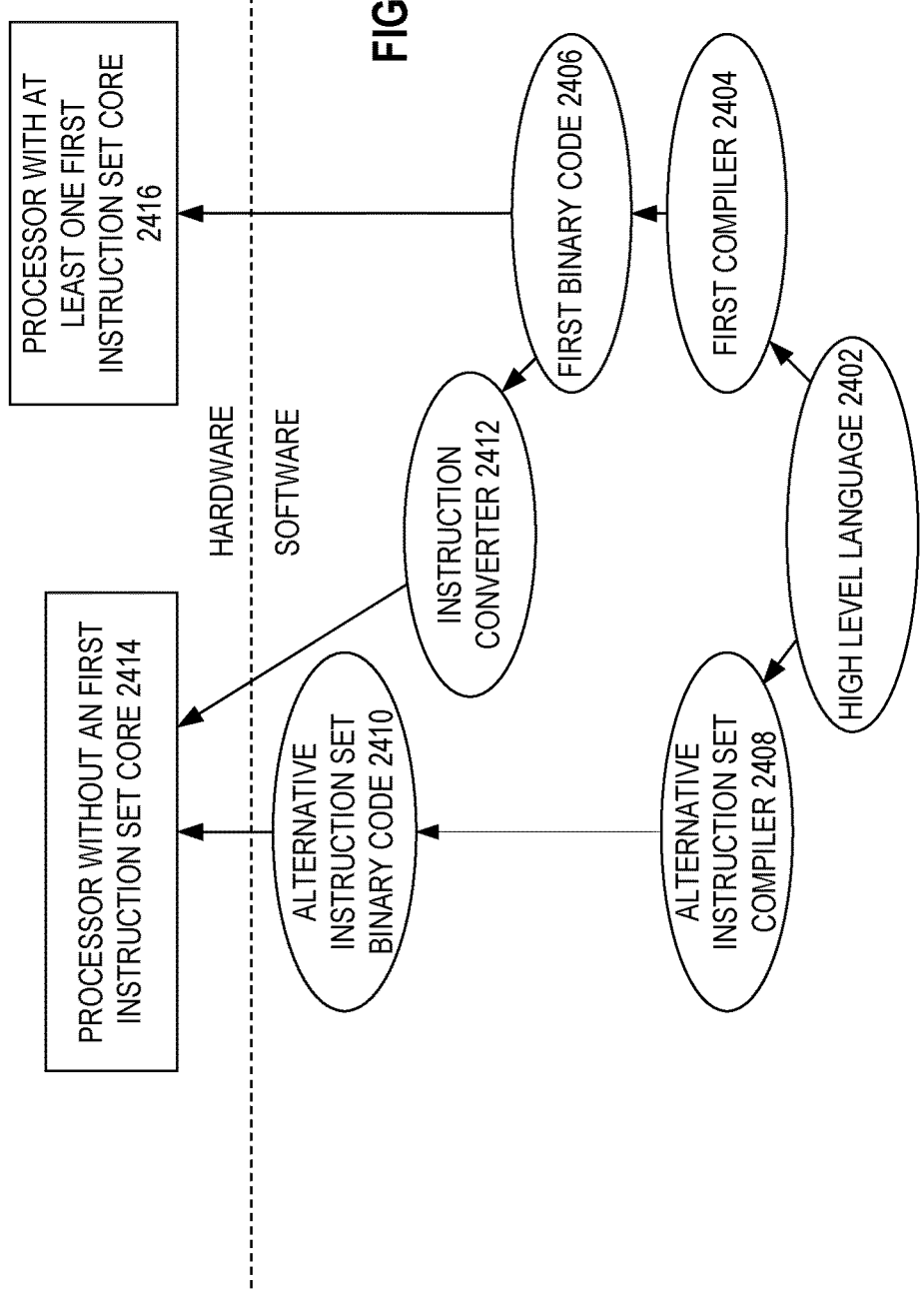

FIXED POINT TO FLOATING POINT CONVERSION

BACKGROUND

There are many different ways to express a number in a computer processor. For example, a whole number may be represented as an integer value. Fractions and other non-integer values may be represented as a fixed-point number with a number of bits used for the integer component and a number of bits used for the fractional part (e.g., INTEGER.FRACTION). Another way to represent fractions is using a floating point number which includes bits for a sign, a digit sting (mantissa, fractional, or significand)—the length of which determines the precision of the number, and an exponent indicating a location of the decimal place.

BRIEF DESCRIPTION OF THE DRAWINGS

The present invention is illustrated by way of example and not limitation in the figures of the accompanying drawings, in which like references indicate similar elements and in which:

FIG. 13 is an embodiment of pseudocode representing the operations of the described instructions;

FIG. 15A illustrates an exemplary instruction format;

FIG. 15B illustrates which fields from FIG. 15A make up a full opcode field and a base operation field;

FIG. 15C illustrates which fields from FIG. 15A make up a register index field;

FIG. 16 is a block diagram of a register architecture according to one embodiment of the invention;

FIG. 17A is a block diagram illustrating both an exemplary in-order pipeline and an exemplary register renaming, out-of-order issue/execution pipeline according to embodiments of the invention;

FIG. 17B is a block diagram illustrating both an exemplary embodiment of an in-order architecture core and an exemplary register renaming, out-of-order issue/execution architecture core to be included in a processor according to embodiments of the invention;

FIG. 24 is a block diagram contrasting the use of a software instruction converter to convert binary instructions in a source instruction set to binary instructions in a target instruction set according to embodiments of the invention.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

At times, it is beneficial to move from one data type (e.g., fixed-point) to another data type (e.g., floating point). Detailed herein are instructions to convert a single fixed-point value from a packed data operand (e.g., single instruction, multiple data (SIMD) or vector register) to a single precision floating point value and store that value in a packed data operand. In particular, embodiments of instructions and their execution for the conversion of a 16-bit fixed-point number to a single precision floating point number (where there is no loss in precision) and for the conversion of a 32-bit fixed-point number to a single precision floating point number (where there could be up to 8 bits of precision loss) are described. Depending upon the implementation, the instructions detailed herein may use packed data register operands of different sizes (e.g., 128-bit, 256-bit, 512-bit registers, etc.) and/or utilize at least a memory location for the source of the instruction. These instructions are improvements to a computer itself as they provide support for a conversion of a particular data element which has not previously been performed. In particular, an execution of a fixed-point to floating point instruction causes a conversion of a data element of a least significant packed data element position of an identified packed data source operand from a fixed-point representation to a floating point representation, storage the floating point representation into a 32-bit least significant packed data element position of an identified packed data destination operand, and zero all remaining packed data elements of the identified packed data destination operand.

Figure 1:
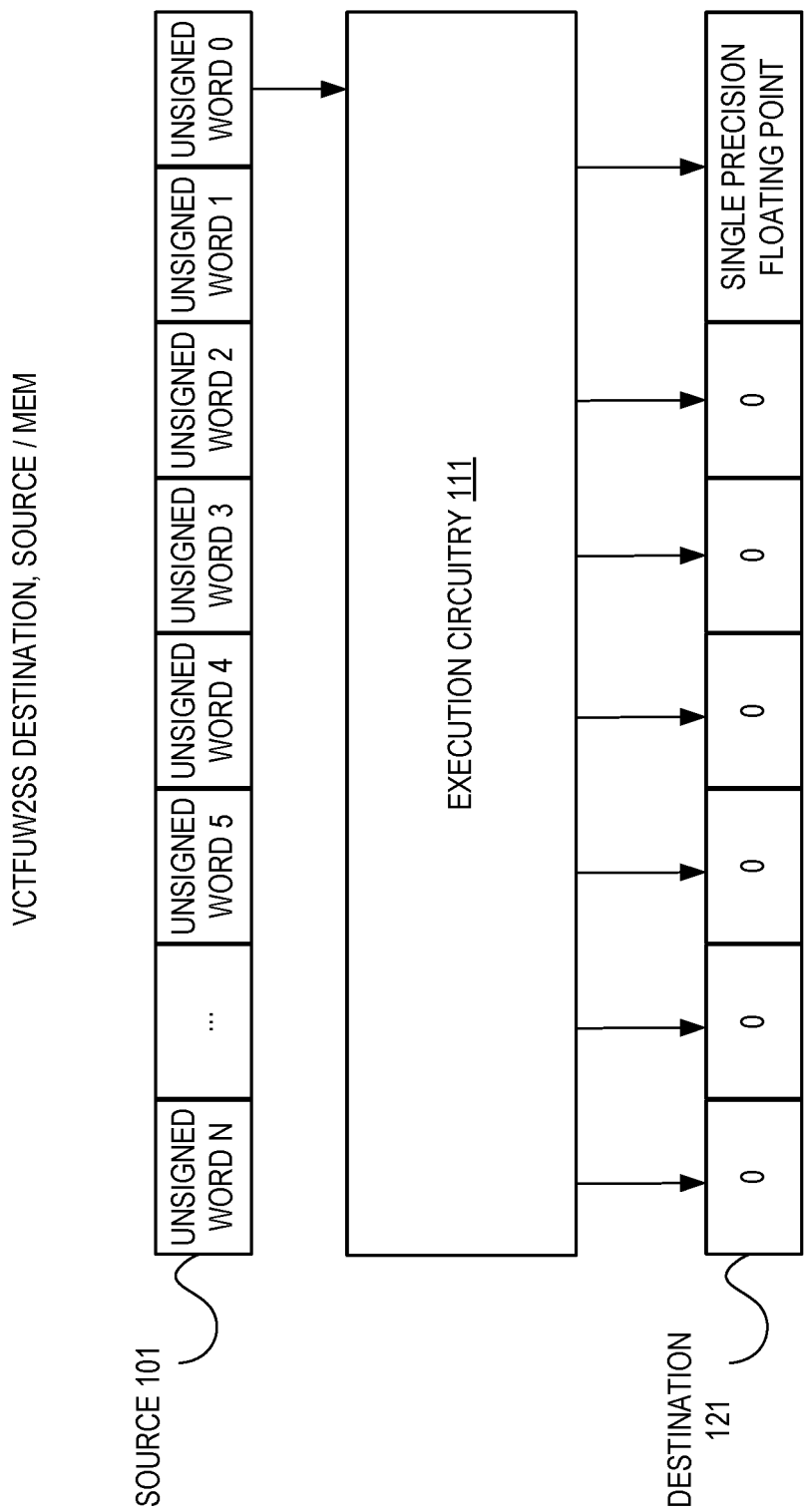
FIG. 1 illustrates an embodiment of a selected portion of execution of a fixed-point to floating point convert instruction having a source operand (either register or memory) and a destination operand.

FIG. 1 illustrates an embodiment of a selected portion of execution of a fixed-point to floating point convert instruction having a source operand (either register or memory) and a destination operand. The format of this instruction includes fields for an opcode ("VCTFUW2SS" is the opcode mnemonic in this illustration), a packed data source operand identifier (shown as "SOURCE/MEM"), and a packed data destination operand identifier (shown as "DESTINATION").

The packed data source operand field represents either a register location of packed data or a memory location for packed data, wherein a single unsigned word (16-bit value) of that packed data is to be converted from fixed-point to single precision floating point value (32-bit floating point value).

The packed data destination operand field represents a register location of packed data, wherein the result of the conversion (a single precision floating point value) is to be stored.

In the illustrated example, the identified source operand 101 has a plurality of unsigned words. The least significant unsigned word is unsigned word 0 and the most significant unsigned word is unsigned word N. The number of unsigned words is dependent upon the size of the identified source operand 101 (e.g., 128-bit, 256-bit, 512-bit, etc.).

Execution circuitry 111 takes the least significant unsigned word from the identified source 101 and converts the value of that unsigned word into a single precision floating point value. A more detailed execution flow is detailed later.

The single precision floating point value is then stored in the identified destination operand 121 in a least significant data element position and all other data element positions are set to 0.

Figure 2:
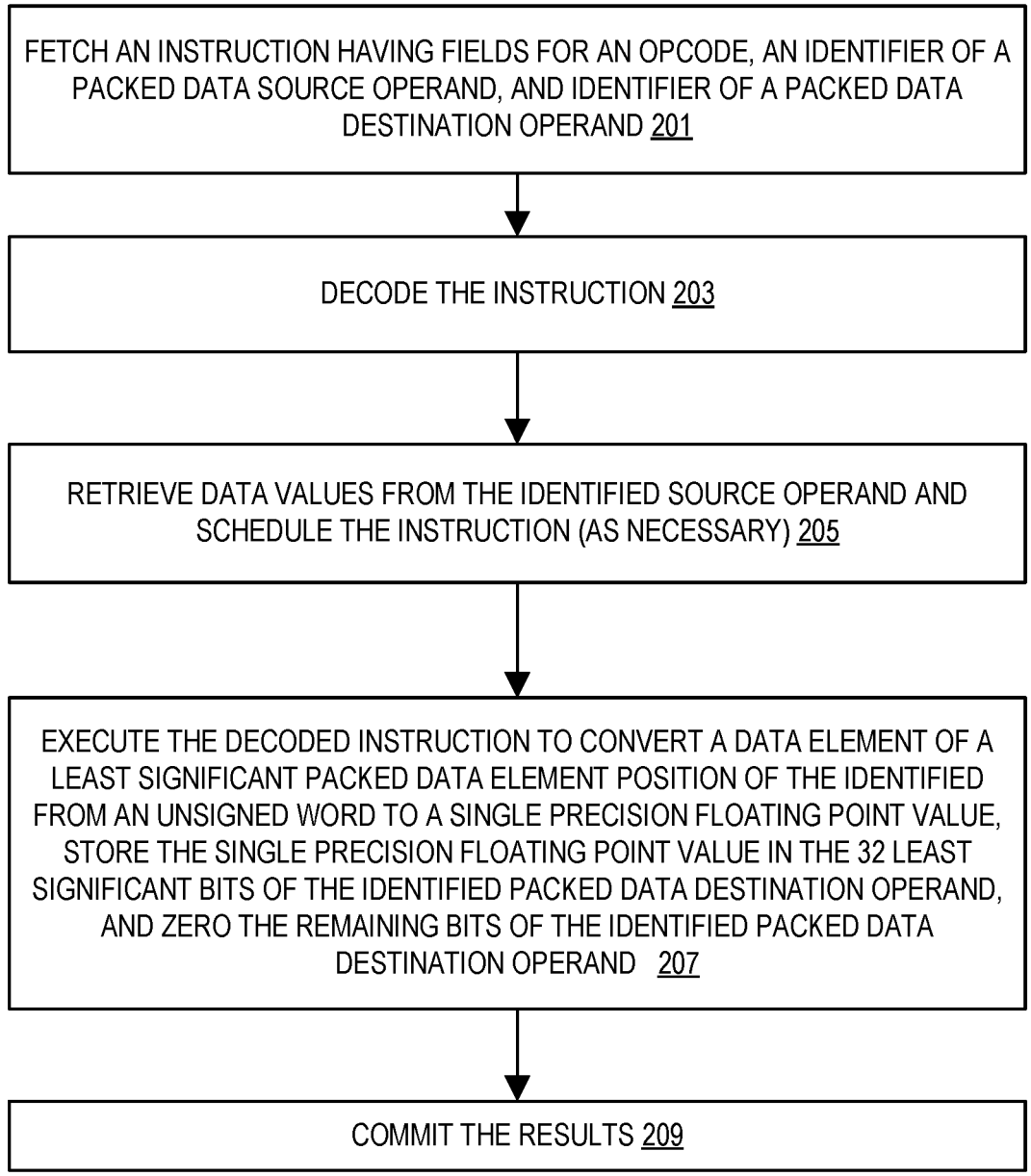
FIG. 2 illustrates an embodiment of method performed by a processor to process a conversion instruction.

FIG. 2 illustrates an embodiment of method performed by a processor to process a conversion instruction.

At 201, an instruction is fetched. For example, a convert instruction is fetched. The convert instruction includes fields for an opcode, a packed data source operand identifier, and a packed data destination operand identifier. In some embodiments, the instruction is fetched from an instruction cache. In some embodiments, the opcode also indicates the data element sizes of the identified source operand and whether the data elements are signed or not.

The fetched instruction is decoded at 203. For example, the fetched convert instruction is decoded by decode circuitry such as that detailed herein.

Data values associated with the identified source operand of the decoded instruction are retrieved at 205 and the decoded instruction is scheduled (as needed). For example, when an identified source operand is a memory operand, the data from the indicated memory location is retrieved.

At 207, the decoded instruction is executed by execution circuitry (hardware) such as that detailed herein. For the convert instruction, the execution will cause execution circuitry to convert an unsigned word data element of a least significant packed data element position of an identified packed data source operand from a fixed-point representation to a floating point representation, store the floating point representation into a 32-bit least significant packed data element position of an identified packed data destination operand, and zero all remaining packed data elements of the identified packed data destination operand.

In some embodiments, the instruction is committed or retired at 209.

Figure 3A:
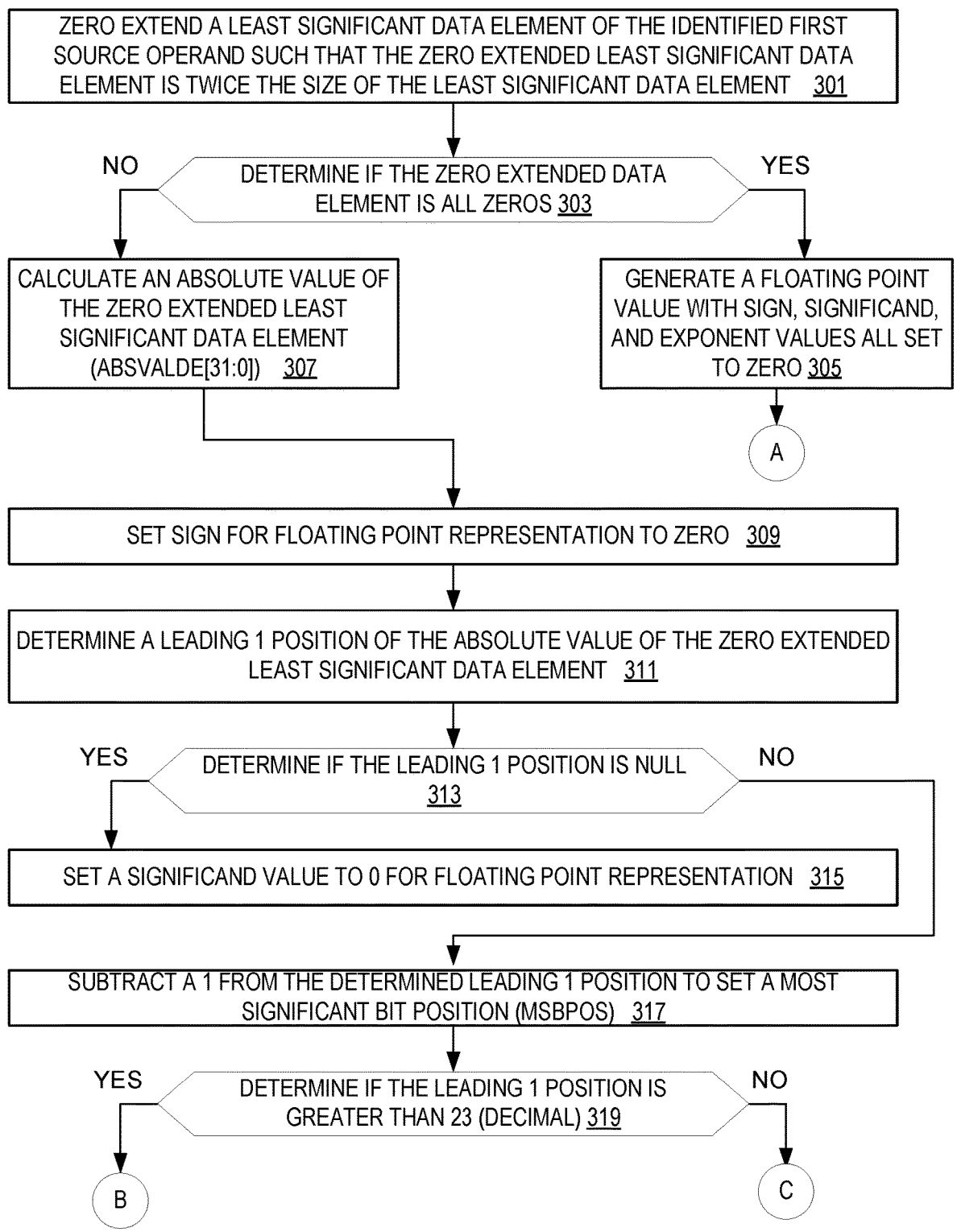
FIGS. 3(A)-(B) illustrate a more detailed description of an execution of a convert an unsigned word from fixed-point to floating point instruction.
Figure 3B:
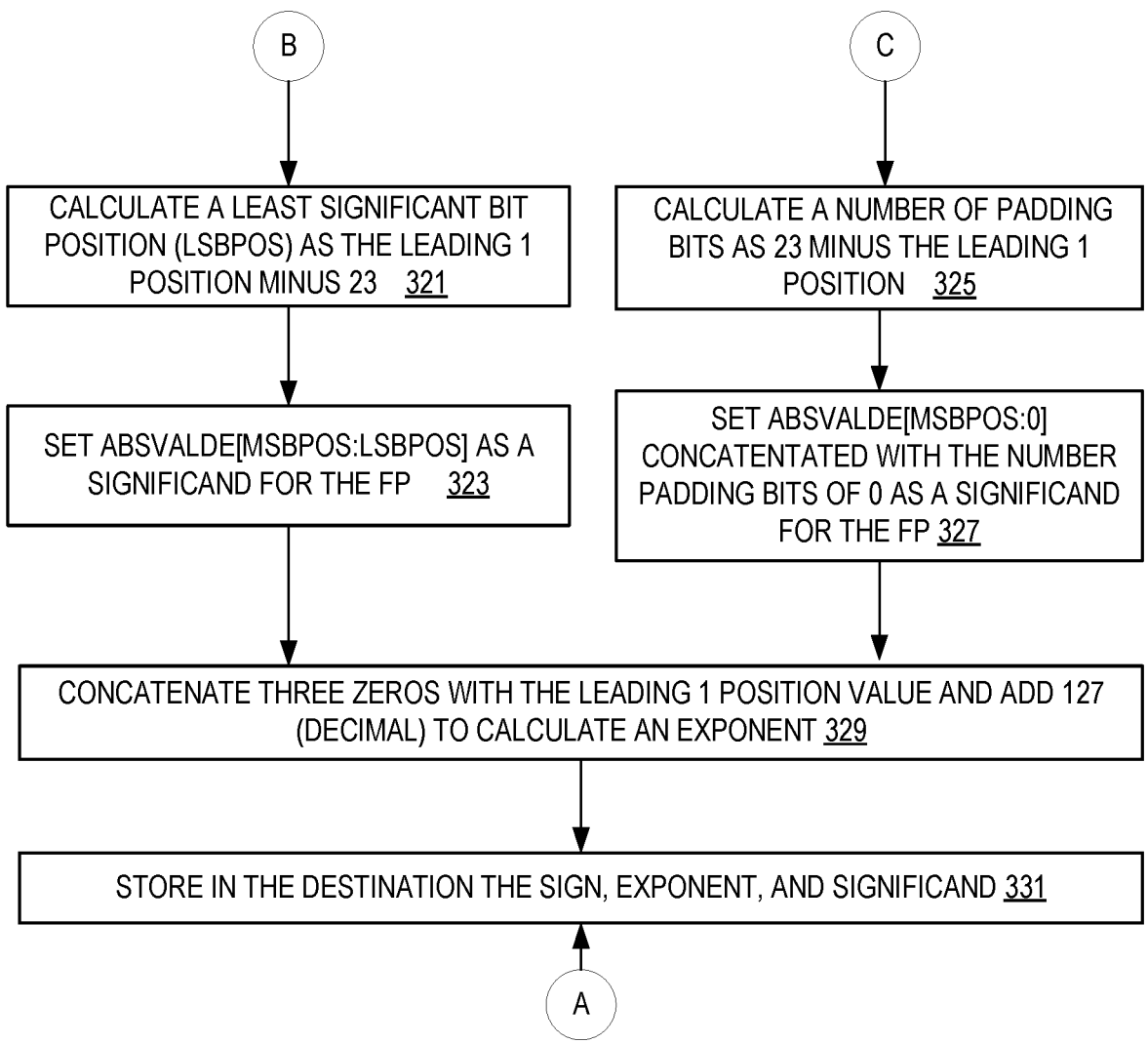

FIGS. 3(A)-(B) illustrate a more detailed description of an execution of a convert an unsigned word from fixed-point to floating point instruction. Typically, this is performed by execution circuitry such as that detailed above. In some embodiments, the circuitry performs this method as a state machine.

At 301, the data element from the least significant packed data element position of the identified packed data source operand is zero extended to 32 bits. For example, 16 zeros are concatenated with the value of the least significant packed data element position of the identified packed data source operand such that the most significant 16 bits are zero and the remaining 16 bits are the value that was stored in the identified source operand.

A determination of whether the zero extended data element is 0 is made at 303. In other words, was the previous value a 0? When this is true, a floating point value with a sign, significand, and exponent are set to 0 at 305 and stored in the least significant data element position of the destination at 331.

When this is false, an absolute value of the zero extended data element from the least significant packed data element position of the identified packed data source operand is calculated at 307. For example, ABSVALDE[31:0] is calculated.

A sign for a floating point representation of the zero extended data element is set to zero at 309.

At 311, a determination of a leading one position of the absolute value of the zero extended data element from the least significant packed data element position of the identified packed data source operand is made. For example, a 5 bit value is generated which can indicate any position in a 32-bit number. This leading one position is the most significant bit position that is a 1.

When the leading one position is null, a significand value is set to zero for the floating point representation at 315.

When the leading one position is not null, a 1 is subtracted from the determined leading one position to set a most significant bit position (msbPos) at 317. For example, msbPos[4:0]←(leadingBit[4:0]-1'b1.

A determination of whether the leading one position is greater than decimal 23 is made at 319. For example, is leadingBit[4:0]>5'd23?

When the leading one position is greater than 23, a calculation of a least significant bit position (lsbPos) is made at 321. For example, lsbPos←leadingBit[4:0]—5'd23 and a significand is set as an absolute value of the zero extended data element using values from the calculated least significant bit position to the calculated most significant bit position at 323. For example, fractional[22:0]←absInteger32Val[msbPos:lsbPos].

When the leading one position is not greater than 23, a number of padding bits are calculated at 325. In some embodiments, this is done by subtracting the leading one value from 23 (e.g., paddingBits←(5'd23—leadingBit[4:0])).

A significand is set as an absolute value of the zero extended data element using values from zero to the calculated most significant bit position concatenated with the number of calculated padding bits at 327. For example, fractional[22:0]←{absInteger32Val[msbPos:0], (paddingBits)'b0}.

At 329, three zeros are concatenated with the leading one position value and 127 is added to calculate an exponent (e.g., exponent[7:0]←8'd127+{3'b0, leadingBit[4:0]}).

The sign, exponent, and significand are stored in the least significant data element position of the destination at 331. Additionally, the remaining bits are set to zero.

Figure 4:
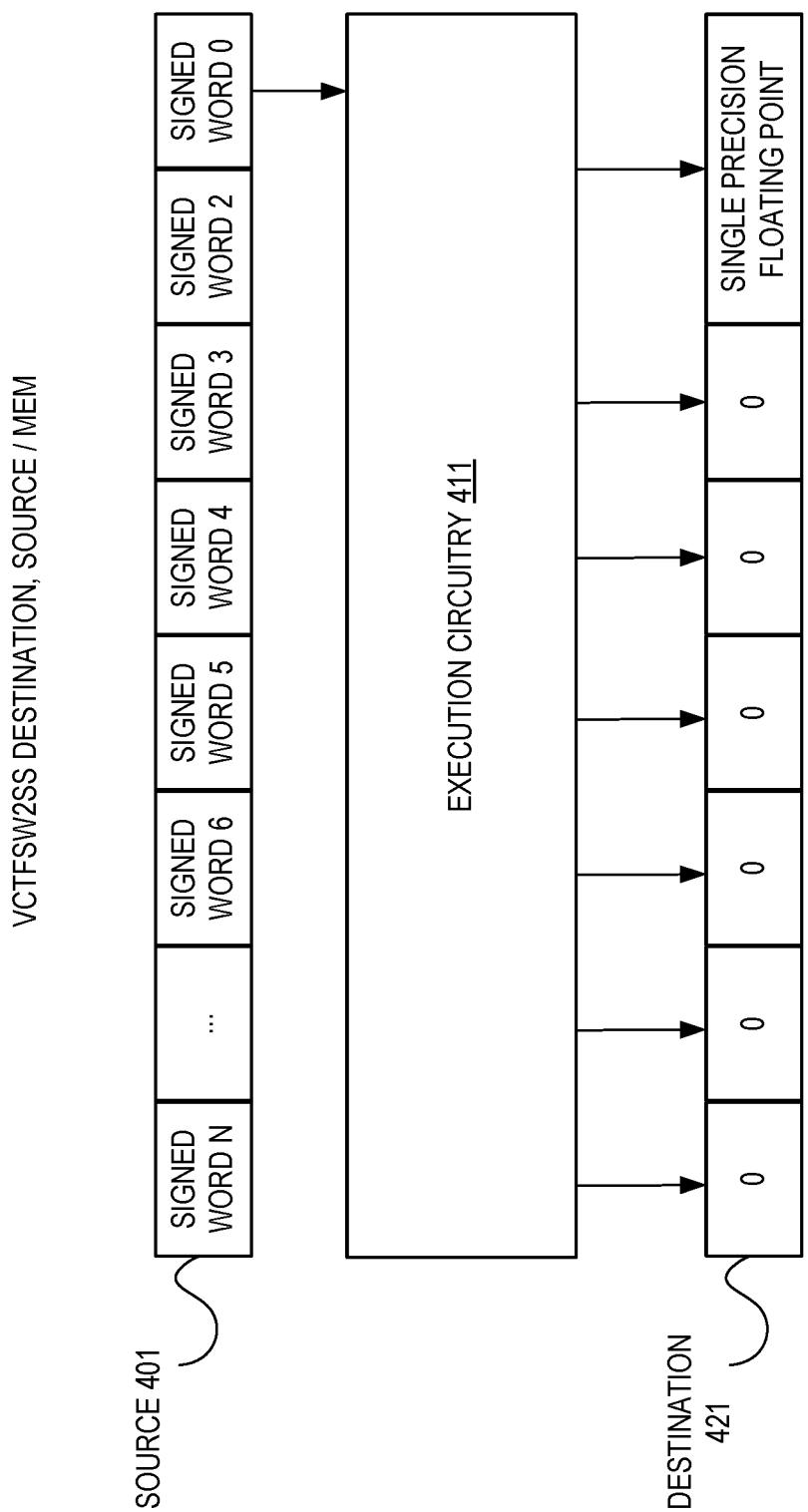
FIG. 4 illustrates an embodiment of a selected portion of execution of a fixed-point to floating point convert instruction having a source operand (either register or memory) and a destination operand.

FIG. 4 illustrates an embodiment of a selected portion of execution of a fixed-point to floating point convert instruction having a source operand (either register or memory) and a destination operand. The format of this instruction includes fields for an opcode ("VCTFSW2SS" is the opcode mnemonic in this illustration), a packed data source operand identifier (shown as "SOURCE/MEM"), and a packed data destination operand identifier (shown as "DESTINATION").

The packed data source operand field represents either a register location of packed data or a memory location for packed data, wherein a single signed word (16-bit value) of that packed data is to be converted from a fixed-point to a single precision floating point value (32-bit floating point value).

The packed data destination operand field represents a register location of packed data where the result of the conversion (a single precision floating point value) is to be stored.

In the illustrated example, the identified source operand 401 has a plurality of signed words. The least significant signed word is signed word 0 and the most significant signed word is signed word N. The number of signed words is dependent upon the size of the identified source operand 401 (e.g., 128-bit, 256-bit, 512-bit, etc.).

Execution circuitry 411 takes the least significant signed word from the identified source 401 and converts the value of that signed word into a single precision floating point value. A more detailed execution flow is detailed later.

The single precision floating point value is then stored in the identified destination operand 421 in a least significant data element position and all other data element positions are set to 0.

Figure 5:
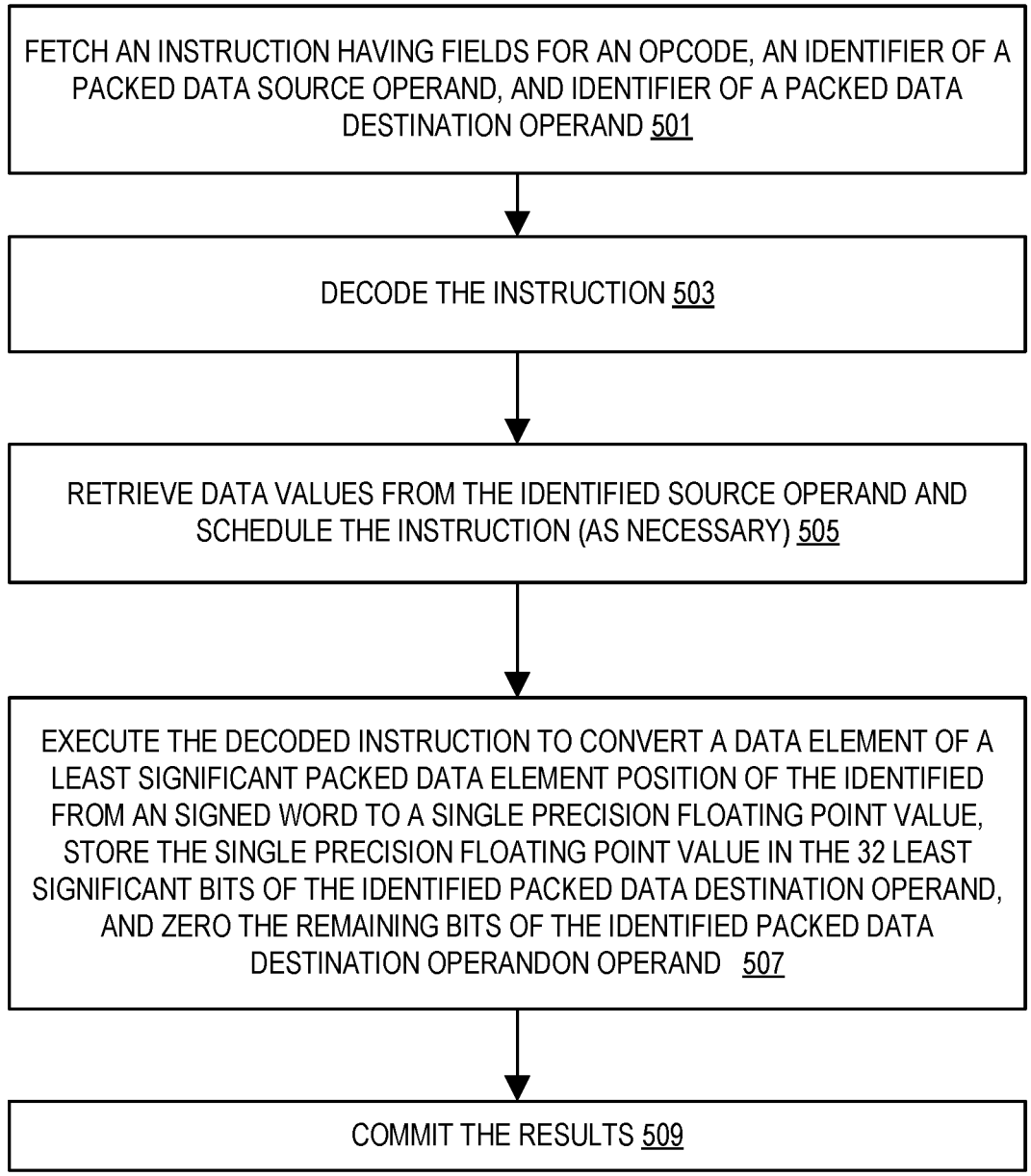
FIG. 5 illustrates an embodiment of method performed by a processor to process a conversion instruction.

FIG. 5 illustrates an embodiment of method performed by a processor to process a conversion instruction.

At 501, an instruction is fetched. For example, a convert instruction is fetched. The convert instruction includes fields for an opcode, a packed data source operand identifier, and a packed data destination operand identifier. In some embodiments, the instruction is fetched from an instruction cache. In some embodiments, the opcode also indicates the data element sizes of the identified source operand and whether the data elements are signed or not.

The fetched instruction is decoded at 503. For example, the fetched convert instruction is decoded by decode circuitry such as that detailed herein.

Data values associated with the identified source operand of the decoded instruction are retrieved at 505 and the decoded instruction is scheduled (as needed). For example, when an identified source operand is a memory operand, the data from the indicated memory location is retrieved.

At 507, the decoded instruction is executed by execution circuitry (hardware) such as that detailed herein. For the convert instruction, the execution will cause execution circuitry to convert a signed word data element of a least significant packed data element position of an identified packed data source operand from a fixed-point representation to a floating point representation, store the floating point representation into a 32-bit least significant packed data element position of an identified packed data destination operand, and zero all remaining packed data elements of the identified packed data destination operand.

In some embodiments, the instruction is committed or retired at 509.

Figure 6A:
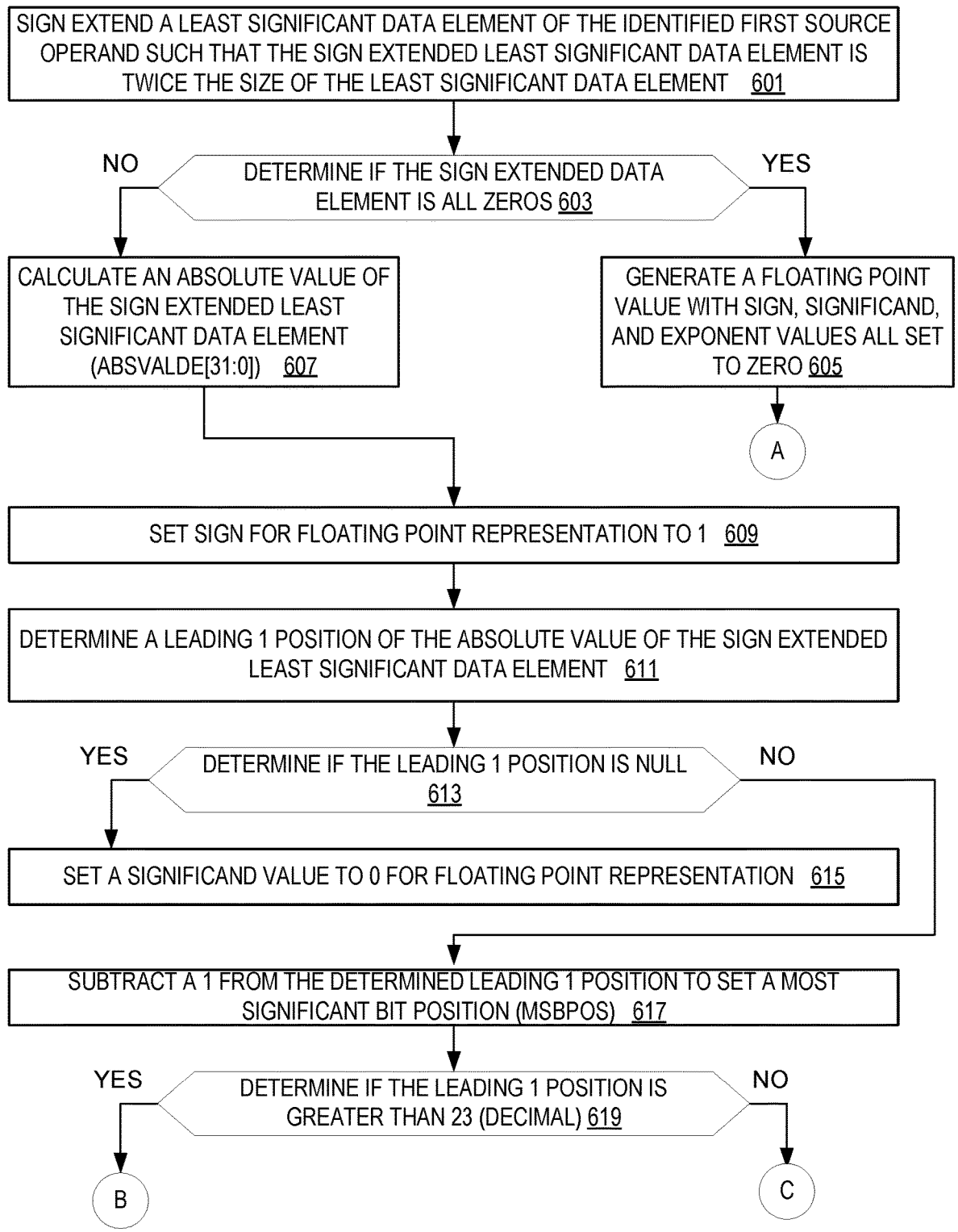
FIGS. 6(A)-(B) illustrate a more detailed description of an execution of a convert a signed word from fixed-point to floating point instruction.
Figure 6B:
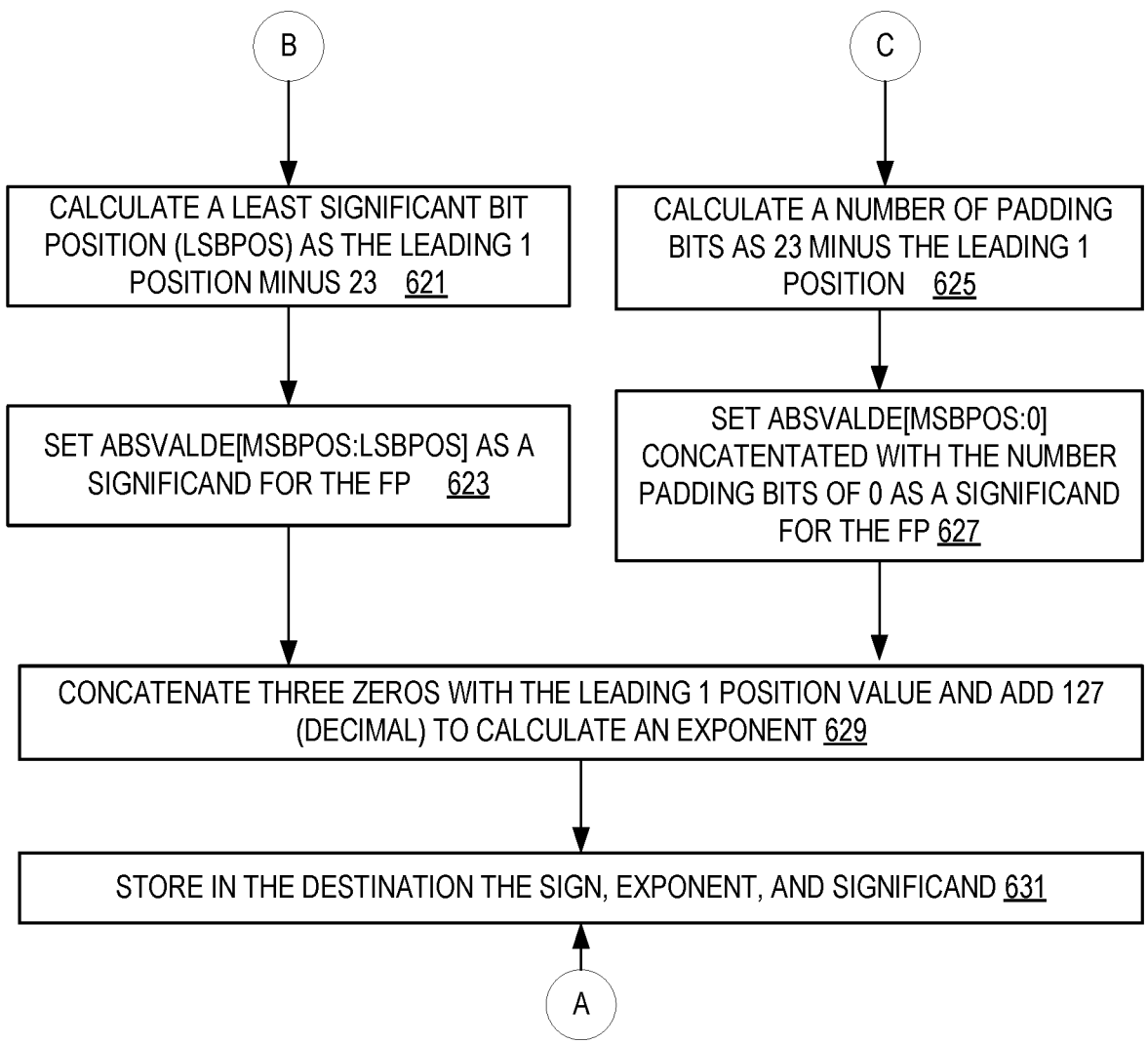

FIGS. 6(A)-(B) illustrate a more detailed description of an execution of a convert a signed word from fixed-point to floating point instruction. Typically, this is performed by execution circuitry such as that detailed above. In some embodiments, the circuitry performs this method as a state machine.

At 601, the data element from the least significant packed data element position of the identified packed data source operand is sign extended to 32 bits. For example, 16 zeros are concatenated with the value of the least significant packed data element position of the identified packed data source operand such that the most significant 16 bits are zero and the remaining 16 bits are the value that was stored in the identified source operand.

A determination of whether the sign extended data element is 0 is made at 603. In other words, was the previous value a 0? When this is true, a floating point value with a sign, significand, and exponent are set to 0 at 605 and stored in the least significant data element position of the destination at 631.

When this is false, an absolute value of the sign extended data element from the least significant packed data element position of the identified packed data source operand is calculated at 607. For example, in some embodiments, ABSVALDE[31:0] is calculated by taking a complement of the sign extended value and adding 1.

A sign for a floating point representation of sign extended data element is set to 1 at 609.

At 611, a determination of a leading one position of the absolute value of the sign extended data element from the least significant packed data element position of the identified packed data source operand is made. For example, a 5 bit value is generated which can indicate any position in a 32-bit number. This leading one position is the most significant bit position that is a 1.

When the leading one position is null, a significand value is set to zero for the floating point representation at 615.

When the leading one position is not null, a 1 is subtracted from the determined leading one position to set a most significant bit position (msbPos) at 617. For example, msbPos[4:0]←(leadingBit[4:0]—1'b1.

A determination of whether the leading one position is greater than decimal 23 is made at 619. For example, is leadingBit[4:0]>5'd23?

When the leading one position is greater than 23, a calculation of a least significant bit position (lsbPos) is made at 621. For example, lsbPos←leadingBit[4:0]—5'd23 and a significand is set as an absolute value of the sign extended data element using values from the calculated least significant bit position to the calculated most significant bit position at 623. For example, fractional[22:0]←absInteger32Val[msbPos:lsbPos].

When the leading one position is not greater than 23, a number of padding bits are calculated at 625. In some embodiments, this is done by subtracting the leading one value from 23 (e.g., paddingBits←(5'd23—leadingBit[4:0])).

A significand is set as an absolute value of the sign extended data element using values from zero to the calculated most significant bit position concatenated with the number of calculated padding bits at 627. For example, fractional[22:0]←{absInteger32Val[msbPos:0], (paddingBits)'b0}.

At 629, three zeros are concatenated with the leading one position value and 127 is added to calculate an exponent (e.g., exponent[7:0]←8'd127+{3'b0, leadingBit[4:0]}).

The sign, exponent, and significand are stored in the least significant data element position of the destination at 631. Additionally, the remaining bits are set to zero.

Figure 7:
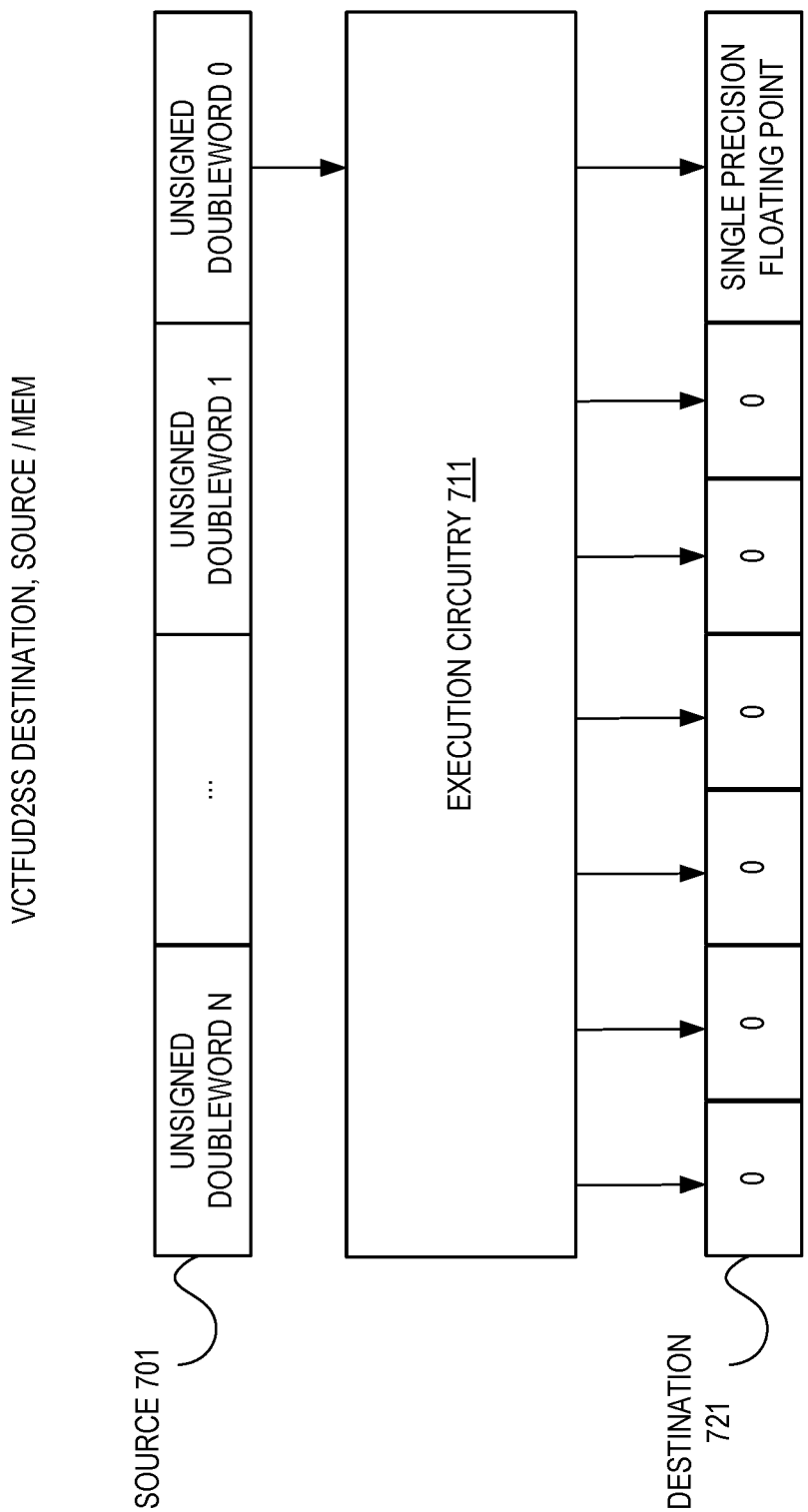
FIG. 7 illustrates an embodiment of a selected portion of execution of a fixed-point to floating point convert instruction having a source operand (either register or memory) and a destination operand.

FIG. 7 illustrates an embodiment of a selected portion of execution of a fixed-point to floating point convert instruction having a source operand (either register or memory) and a destination operand. The format of this instruction includes fields for an opcode ("VCTFUD2SS" is the opcode mnemonic in this illustration), a packed data source operand identifier (shown as "SOURCE/MEM"), and a packed data destination operand identifier (shown as "DESTINATION").

The packed data source operand field represents either a register location of packed data or a memory location for packed data, wherein a single unsigned doubleword (32-bit value) of that packed data is to be converted from fixed-point to single precision floating point value (32-bit floating point value).

The packed data destination operand field represents a register location of packed data where the result of the conversion (a single precision floating point value) is to be stored.

In the illustrated example, the identified source operand 701 has a plurality of unsigned doublewords. The least significant unsigned doubleword is unsigned doubleword 0 and the most significant unsigned doubleword is unsigned doubleword N. The number of unsigned doublewords is dependent upon the size of the identified source operand 701 (e.g., 128-bit, 256-bit, 512-bit, etc.).

Execution circuitry 711 takes the least significant unsigned doubleword from the identified source 701 and converts the value of that unsigned doubleword into a single precision floating point value. A more detailed execution flow is detailed later.

The single precision floating point value is then stored in the identified destination operand 721 in a least significant data element position and all other data element positions are set to 0.

Figure 8:
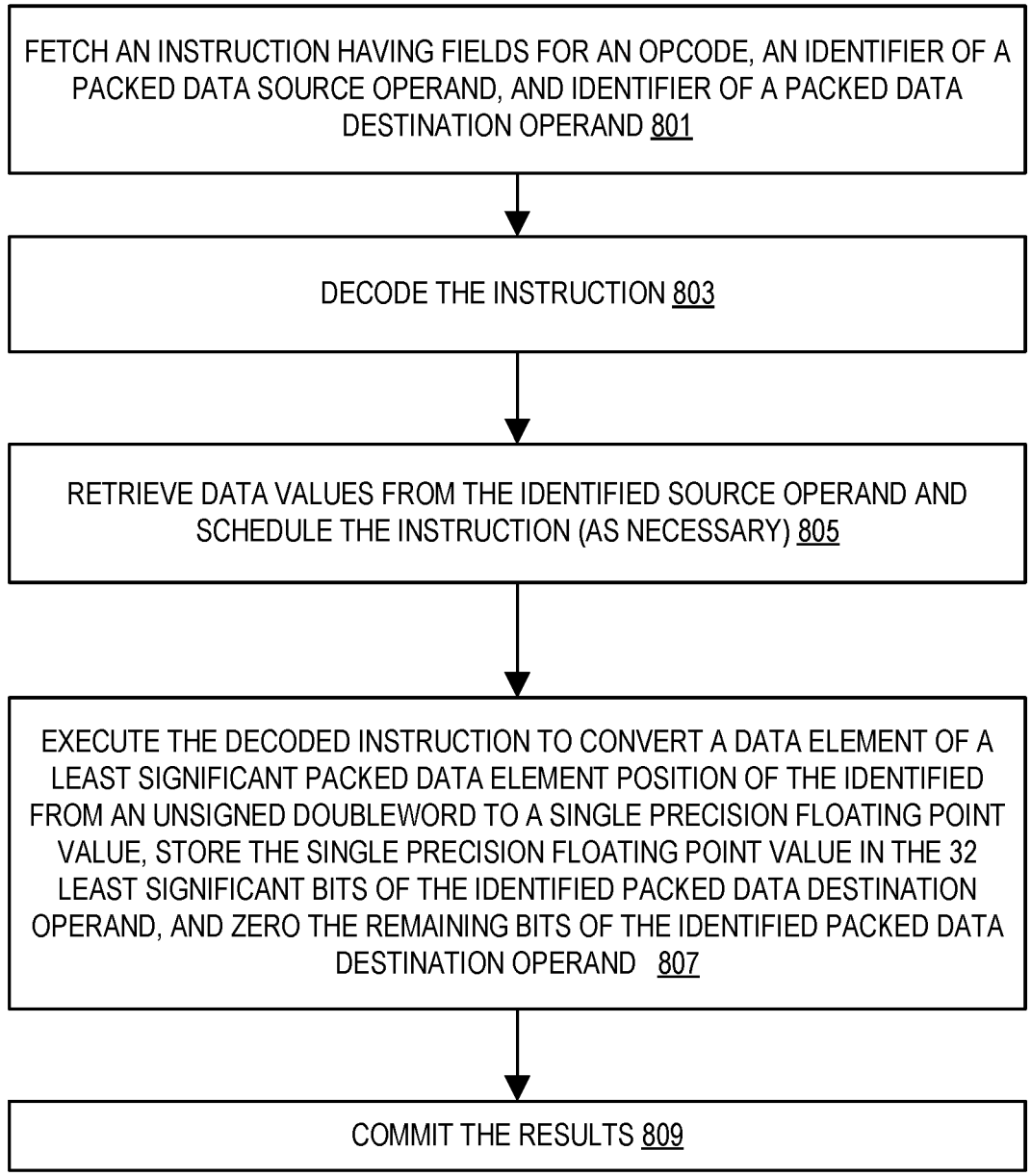
FIG. 8 illustrates an embodiment of method performed by a processor to process a conversion instruction.

FIG. 8 illustrates an embodiment of method performed by a processor to process a conversion instruction.

At 801, an instruction is fetched. For example, a convert instruction is fetched. The convert instruction includes fields for an opcode, a packed data source operand identifier, and a packed data destination operand identifier. In some embodiments, the instruction is fetched from an instruction cache. In some embodiments, the opcode also indicates the data element sizes of the identified source operand and whether the data elements are signed or not.

The fetched instruction is decoded at 803. For example, the fetched convert instruction is decoded by decode circuitry such as that detailed herein.

Data values associated with the identified source operand of the decoded instruction are retrieved at 805 and the decoded instruction is scheduled (as needed). For example, when an identified source operand is a memory operand, the data from the indicated memory location is retrieved.

At 807, the decoded instruction is executed by execution circuitry (hardware) such as that detailed herein. For the convert instruction, the execution will cause execution circuitry to convert an unsigned doubleword data element of a least significant packed data element position of an identified packed data source operand from a fixed-point representation to a floating point representation, store the floating point representation into a 32-bit least significant packed data element position of an identified packed data destination operand, and zero all remaining packed data elements of the identified packed data destination operand.

In some embodiments, the instruction is committed or retired at 809.

Figure 9A:
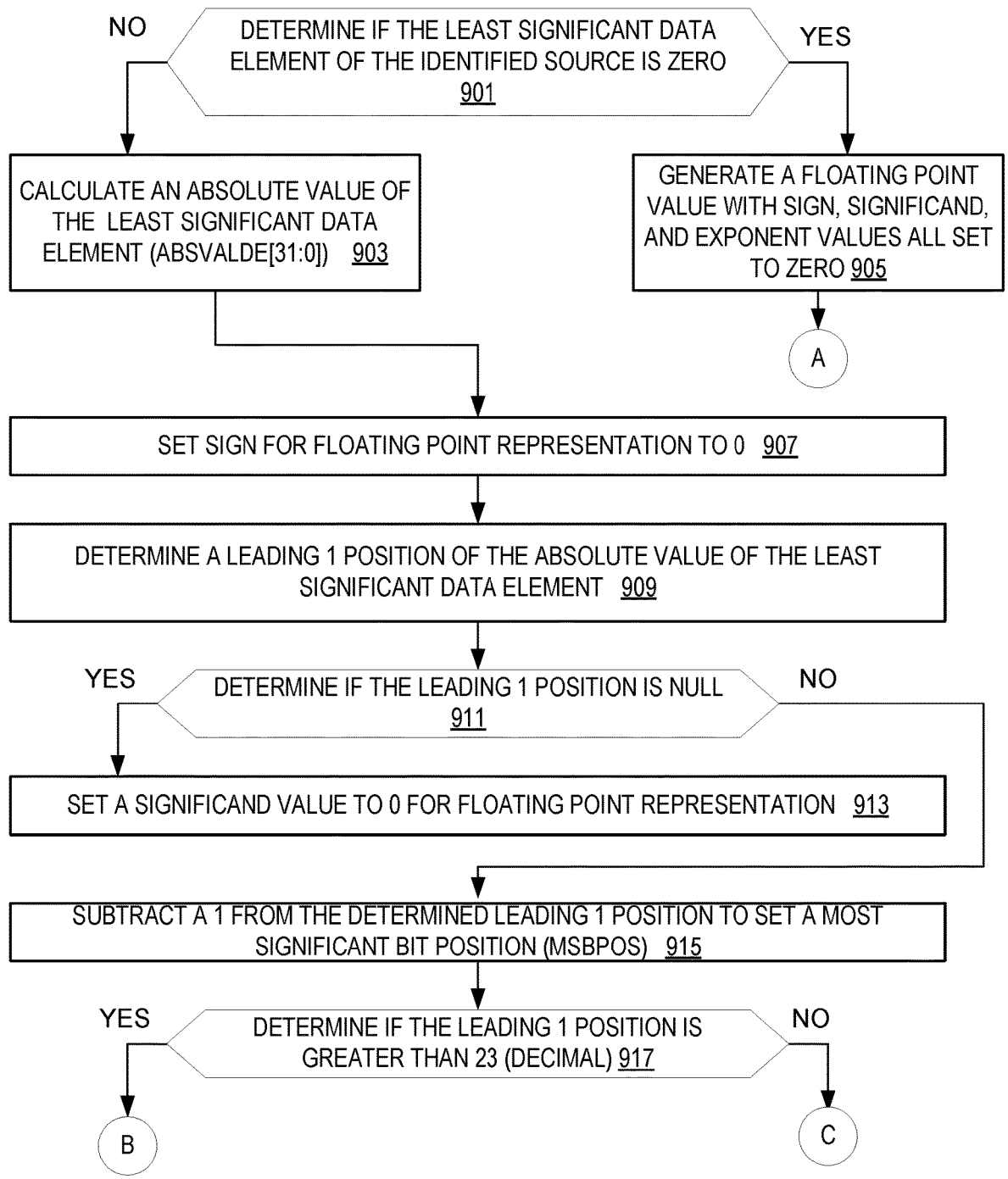
FIGS. 9(A)-(B) illustrate a more detailed description of an execution of a convert an unsigned doubleword from fixed-point to floating point instruction.
Figure 9B:
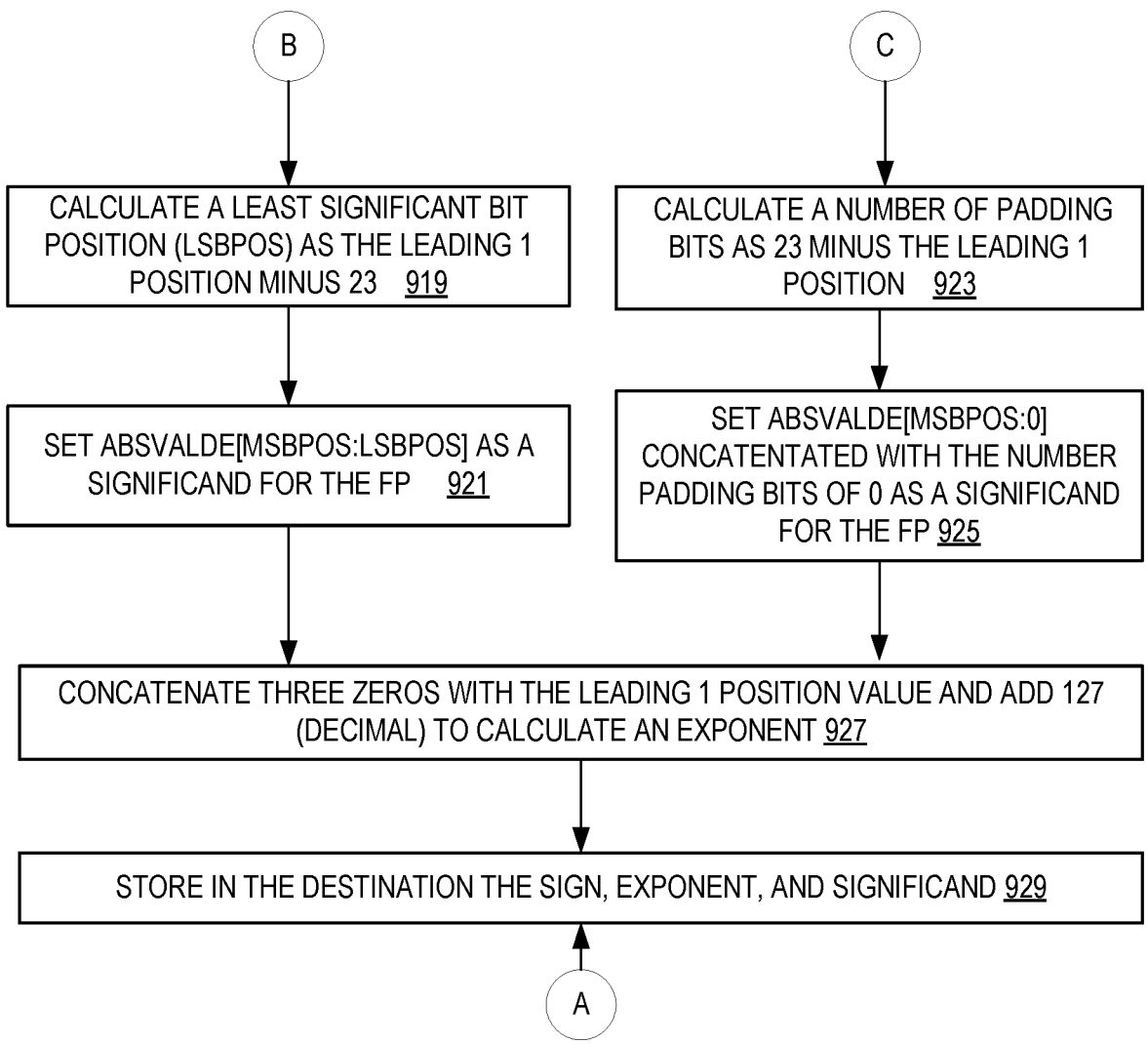

FIGS. 9(A)-(B) illustrate a more detailed description of an execution of a convert an unsigned doubleword from fixed-point to floating point instruction. Typically, this is performed by execution circuitry such as that detailed above. In some embodiments, the circuitry performs this method as a state machine.

A determination of whether the least significant data element position's data element of the identified source is 0 is made at 901. In other words, was the previous value a 0? When this is true, a floating point value with a sign, significand, and exponent are set to 0 at 905 and stored in the least significant data element position of the destination at 929.

When this is false, an absolute value of the data element from the least significant packed data element position of the identified packed data source operand is calculated at 903. For example, ABSVAEDE[31:0] is calculated.

A sign for a floating point representation of the least significant data element is set to zero at 907.

At 909, a determination of a leading one position of the absolute value of the data element from the least significant packed data element position of the identified packed data source operand is made. For example, a 5 bit value is generated which can indicate any position in a 32-bit number. This leading one position is the most significant bit position that is a 1.

When the leading one position is null, a significand value is set to zero for the floating point representation at 913.

When the leading one position is not null, a 1 is subtracted from the determined leading one position to set a most significant bit position (msbPos) at 915. For example, msbPos[4:0]←(leadingBit[4:0]—1'b1).

A determination of whether the leading one position is greater than decimal 23 is made at 917. For example, is leadingBit[4:0]>5'd23?

When the leading one position is greater than 23, a calculation of a least significant bit position (lsbPos) is made at 919. For example, lsbPos←leadingBit[4:0]—5'd23 and a significand is set as an absolute value of the zero extended data element using values from the calculated least significant bit position to the calculated most significant bit position at 921. For example, fractional[22:0]←absInteger32Val[msbPos:lsbPos].

When the leading one position is not greater than 23, a number of padding bits are calculated at 923. In some embodiments, this is done by subtracting the leading one value from 23 (e.g., paddingBits←(5'd23—leadingBit[4:0])).

A significand is set as an absolute value of the zero extended data element using values from zero to the calculated most significant bit position concatenated with the number of calculated padding bits at 925. For example, fractional[22:0]←{absInteger32Val[msbPos:0], (paddingBits)'b0}.

At 927, three zeros are concatenated with the leading one position value and 127 is added to calculate an exponent (e.g., exponent[7:0]←8'd127+{3'b0, leadingBit[4:0]}).

The sign, exponent, and significand are stored in the least significant data element position of the destination at 929. Additionally, the remaining bits are set to zero.

Figure 10:
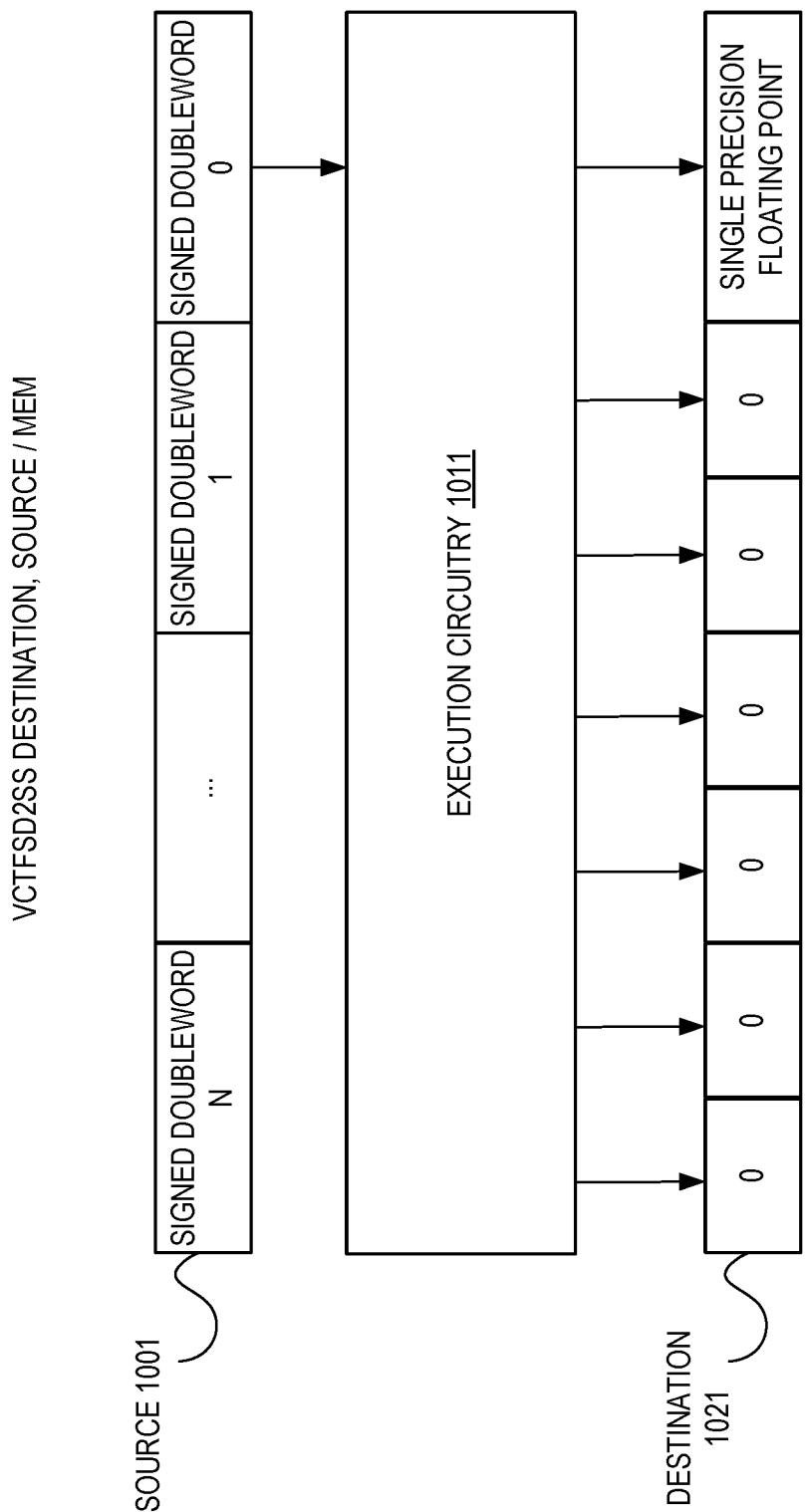
FIG. 10 illustrates an embodiment of a selected portion of execution of a fixed-point to floating point convert instruction having a source operand (either register or memory) and a destination operand.

FIG. 10 illustrates an embodiment of a selected portion of execution of a fixed-point to floating point convert instruction having a source operand (either register or memory) and a destination operand. The format of this instruction includes fields for an opcode ("VCTFUD2SS" is the opcode mnemonic in this illustration), a packed data source operand identifier (shown as "SOURCE/MEM"), and a packed data destination operand identifier (shown as "DESTINATION").

The packed data source operand field represents either a register location of packed data or a memory location for packed data, wherein a single signed doubleword (32-bit value) of that packed data is to be converted from fixed-point to single precision floating point value (32-bit floating point value).

The packed data destination operand field represents a register location of packed data where the result of the conversion (a single precision floating point value) is to be stored.

In the illustrated example, the identified source operand 1001 has a plurality of signed doublewords. The least significant signed doubleword is signed doubleword 0 and the most significant signed doubleword is signed doubleword N. The number of signed doublewords is dependent upon the size of the identified source operand 1001 (e.g., 128-bit, 256-bit, 512-bit, etc.).

Execution circuitry 1011 takes the least significant signed doubleword from the identified source 1001 and converts the value of that signed doubleword into a single precision floating point value. A more detailed execution flow is detailed later.

The single precision floating point value is then stored in the identified destination operand 1021 in a least significant data element position and all other data element positions are set to 0.

Figure 11:
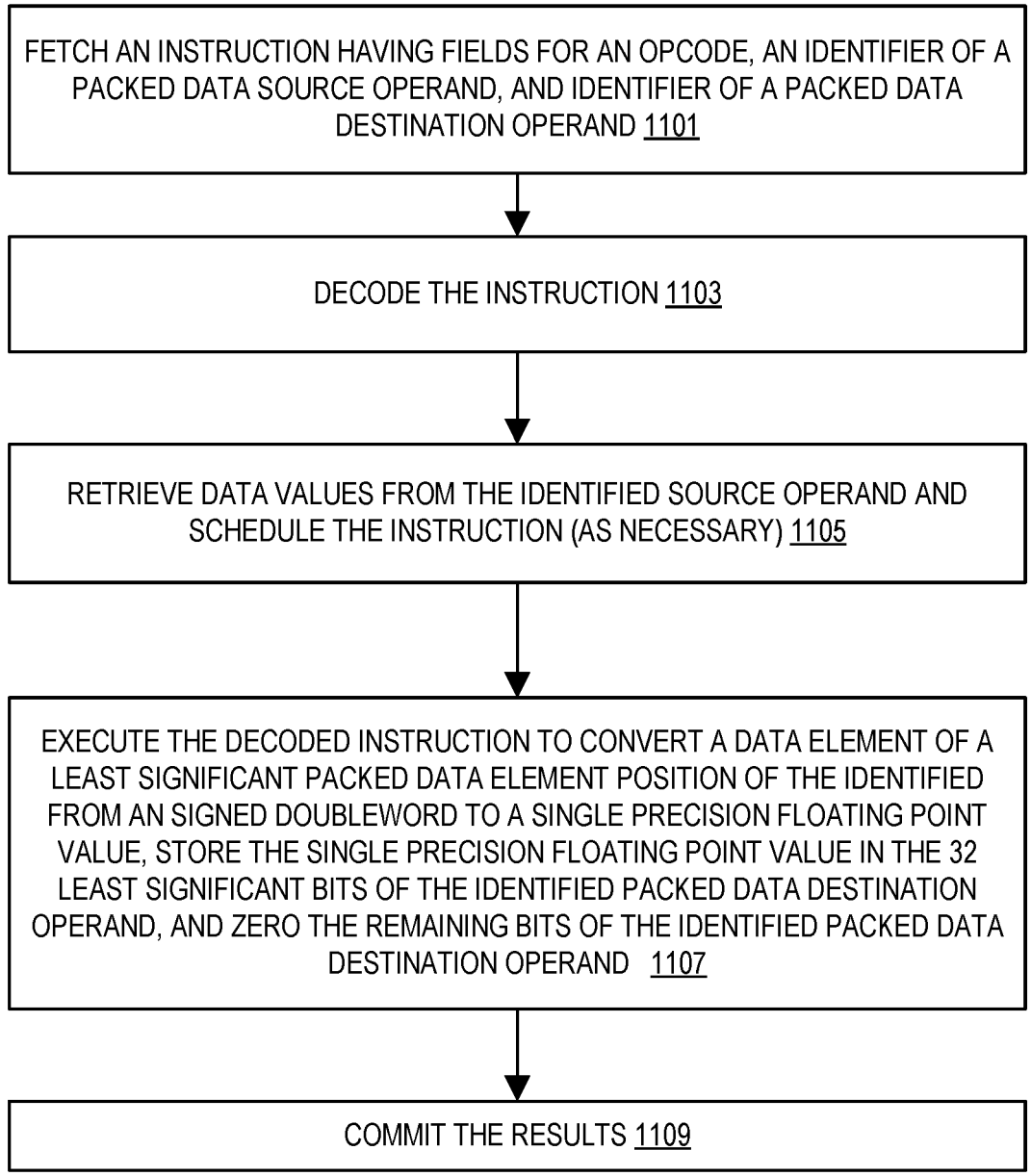
FIG. 11 illustrates an embodiment of method performed by a processor to process a conversion instruction.

FIG. 11 illustrates an embodiment of method performed by a processor to process a conversion instruction.

At 1101, an instruction is fetched. For example, a convert instruction is fetched. The convert instruction includes fields for an opcode, a packed data source operand identifier, and a packed data destination operand identifier. In some embodiments, the instruction is fetched from an instruction cache. In some embodiments, the opcode also indicates the data element sizes of the identified source operand and whether the data elements are signed or not.

The fetched instruction is decoded at 1103. For example, the fetched convert instruction is decoded by decode circuitry such as that detailed herein.

Data values associated with the identified source operand of the decoded instruction are retrieved at 1105 and the decoded instruction is scheduled (as needed). For example, when an identified source operand is a memory operand, the data from the indicated memory location is retrieved.

At 1107, the decoded instruction is executed by execution circuitry (hardware) such as that detailed herein. For the convert instruction, the execution will cause execution circuitry to convert a signed doubleword data element of a least significant packed data element position of an identified packed data source operand from a fixed-point representation to a floating point representation, store the floating point representation into a 32-bit least significant packed data element position of an identified packed data destination operand, and zero all remaining packed data elements of the identified packed data destination operand.

In some embodiments, the instruction is committed or retired at 1109.

Figure 12A:
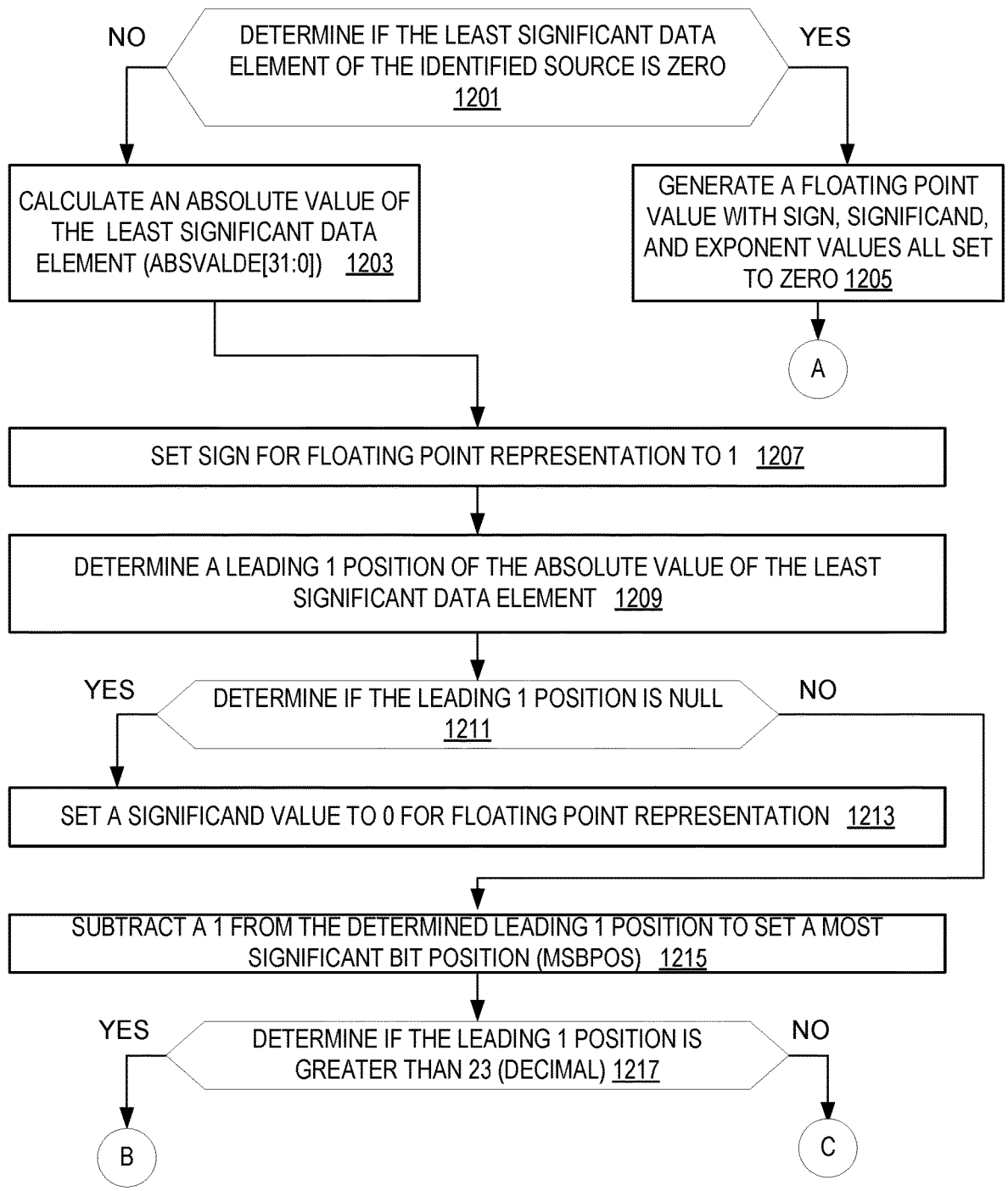
FIGS. 12(A)-(B) illustrate a more detailed description of an execution of a convert a signed doubleword from fixed-point to floating point instruction.
Figure 12B:
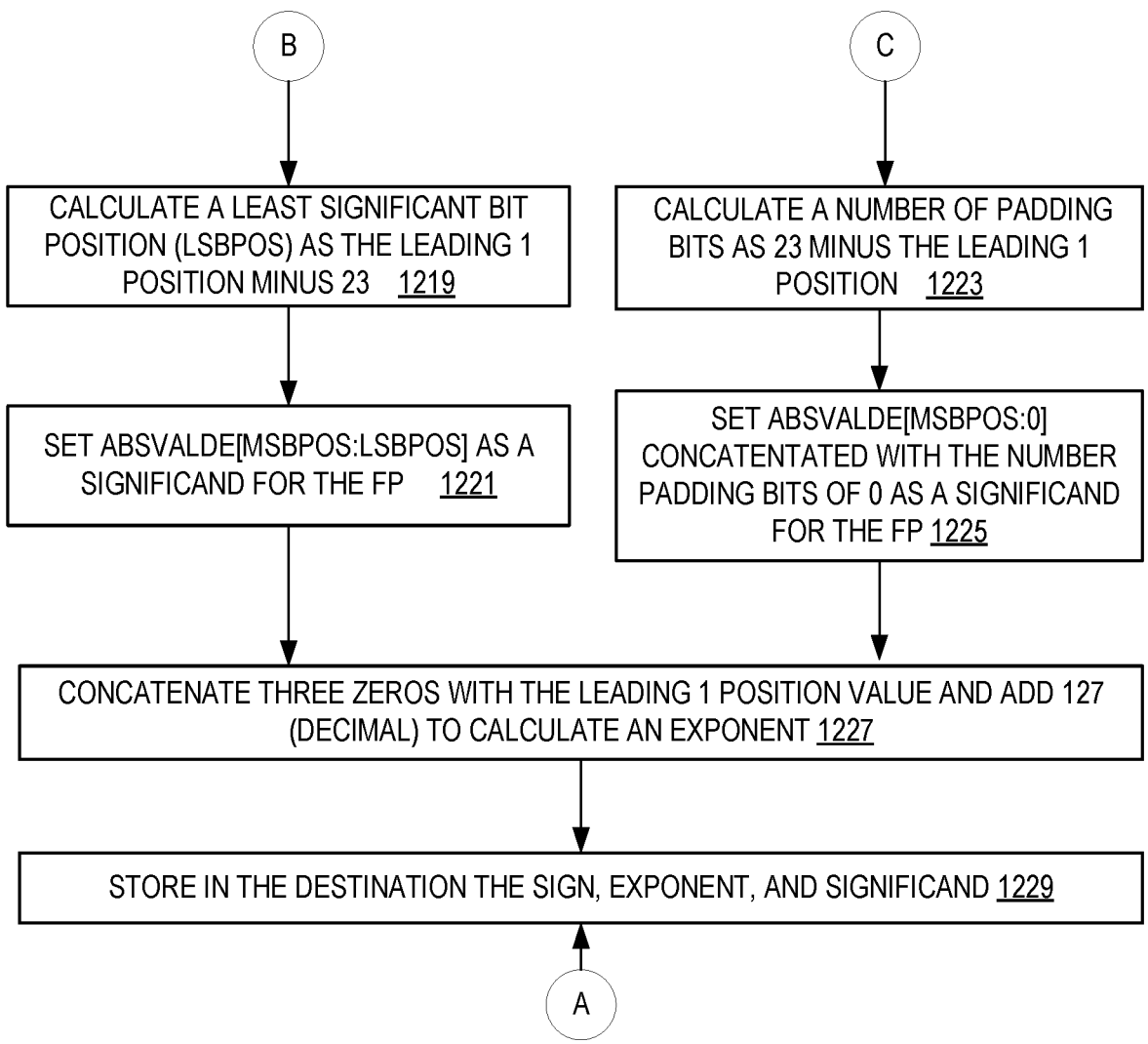

FIGS. 12(A)-(B) illustrate a more detailed description of an execution of a convert a signed doubleword from fixed-point to floating point instruction. Typically, this is performed by execution circuitry such as that detailed above. In some embodiments, the circuitry performs this method as a state machine.

A determination of whether the least significant data element position's data element of the identified source is 0 is made at 1201. In other words, was the previous value a 0? When this is true, a floating point value with a sign, significand, and exponent are set to 0 at 1205 and stored in the least significant data element position of the destination at 1229.

When this is false, an absolute value of the data element from the least significant packed data element position of the identified packed data source operand is calculated at 1203. For example, ABSVALDE[31:0] is calculated.

A sign for a floating point representation of the least significant data element is set to one at 1207.

At 1209, a determination of a leading one position of the absolute value of the data element from the least significant packed data element position of the identified packed data source operand is made. For example, a 5 bit value is generated which can indicate any position in a 32-bit number. This leading one position is the most significant bit position that is a 1.

When the leading one position is null, a significand value is set to zero for the floating point representation at 1213.

When the leading one position is not null, a 1 is subtracted from the determined leading one position to set a most significant bit position (msbPos) at 1215. For example, msbPos[4:0]←(leadingBit[4:0]—1'b1).

A determination of whether the leading one position is greater than decimal 23 is made at 1217. For example, is leadingBit[4:0]>5'd23?

When the leading one position is greater than 23, a calculation of a least significant bit position (IsbPos) is made at 1219. For example, IsbPos←leadingBit[4:0]—5'd23 and a significand is set as an absolute value of the zero extended data element using values from the calculated least significant bit position to the calculated most significant bit position at 1221. For example, fractional[22:0]←absInteger32Val[msbPos:IsbPos].

When the leading one position is not greater than 23, a number of padding bits are calculated at 1223. In some embodiments, this is done by subtracting the leading one value from 23 (e.g., paddingBits←(5'd23—leadingBit[4:0])).

A significand is set as an absolute value of the zero extended data element using values from zero to the calculated most significant bit position concatenated with the number of calculated padding bits at 1225. For example, fractional[22:0]←{absInteger32Val[msbPos:0], (paddingBits)'b0}.

At 1227, three zeros are concatenated with the leading one position value and 127 is added to calculate an exponent (e.g., exponent[7:0]←8'd127+{3'b0, leadingBit[4:0]}).

The sign, exponent, and significand are stored in the least significant data element position of the destination at 1229. Additionally, the remaining bits are set to zero.

Figure 14:
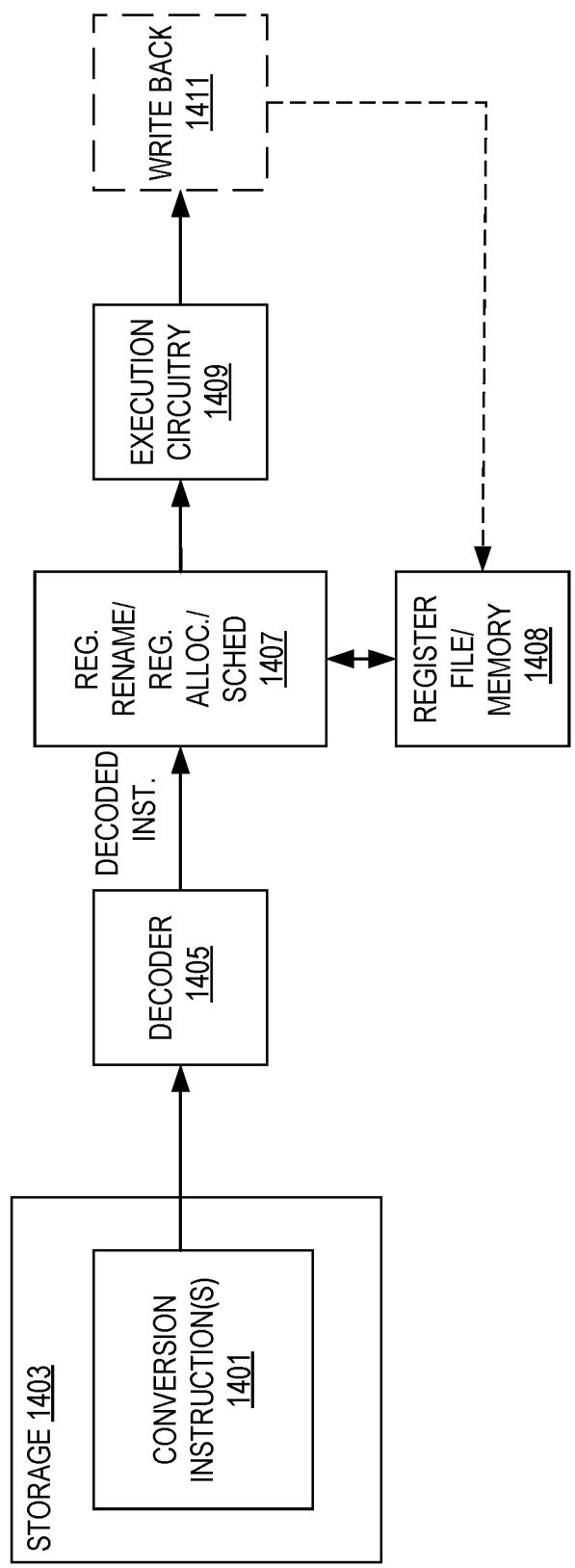
FIG. 14 illustrates an embodiment of hardware to process an instruction such as the conversion instructions detailed herein.

FIG. 13 is an embodiment of pseudocode representing the operations of the described instructions;

FIG. 14 illustrates an embodiment of hardware to process an instruction such as the conversion instructions detailed herein. As illustrated, storage 1403 stores a conversion instruction 1401 to be executed.

The instruction 1401 is received by decode circuitry 1405. For example, the decode circuitry 1405 receives this instruction from fetch logic/circuitry. The instruction includes fields for an opcode, a source identifier, and a destination identifier. In some embodiments, the source and destination are registers, and in other embodiments one or more are memory locations.

More detailed embodiments of at least one instruction format will be detailed later. The decode circuitry 1405 decodes the instruction into one or more operations. In some embodiments, this decoding includes generating a plurality of micro-operations to be performed by execution circuitry (such as execution circuitry 1409). The decode circuitry 1405 also decodes instruction prefixes.

In some embodiments, register renaming, register allocation, and/or scheduling circuitry 1407 provides functionality for one or more of: 1) renaming logical operand values to physical operand values (e.g., a register alias table in some embodiments), 2) allocating status bits and flags to the decoded instruction, and 3) scheduling the decoded instruction for execution on execution circuitry out of an instruction pool (e.g., using a reservation station in some embodiments).

Registers (register file) and/or memory 1408 store data as operands of the instruction to be operated on by execution circuitry 1409. Exemplary register types include packed data registers, general purpose registers, and floating point registers.

Execution circuitry 1409 executes the decoded instruction. The execution of the decoded instruction causes the execution circuitry to convert a data element of a least significant packed data element position of an identified packed data source operand from a fixed-point representation to a floating point representation, store the floating point representation into a 32-bit least significant packed data element position of an identified packed data destination operand, and zero all remaining packed data elements of the identified packed data destination operand.

In some embodiments, retirement/write back circuitry 1411 architecturally commits the destination register into the registers or memory 1408 and retires the instruction.

An embodiment of a format for the above instructions is CONVERTOPCODE DST, SRC/MEM. CONVERTOPCODE is the opcode of the instruction. Exemplary opcode mnemonics have been detailed above. DST is a field identifying a destination operand. SRC1 is a field for a source operand identifier such as a register and/or memory location. In some embodiments, the operand fields are encoded using VVVV field 1520, MOD R/M 1540, and/or SIB 1550.

In embodiments, encodings of the instruction include a scale-index-base (SIB) type memory addressing operand that indirectly identifies multiple indexed destination locations in memory (e.g., field 1550). In one embodiment, an SIB type memory operand may include an encoding identifying a base address register. The contents of the base address register may represent a base address in memory from which the addresses of the particular destination locations in memory are calculated. For example, the base address may be the address of the first location in a block of potential destination locations for an extended vector instruction. In one embodiment, an SIB type memory operand may include an encoding identifying an index register. Each element of the index register may specify an index or offset value usable to compute, from the base address, an address of a respective destination location within a block of potential destination locations. In one embodiment, an SIB type memory operand may include an encoding specifying a scaling factor to be applied to each index value when computing a respective destination address. For example, if a scaling factor value of four is encoded in the SIB type memory operand, each index value obtained from an element of the index register may be multiplied by four and then added to the base address to compute a destination address.

In one embodiment, an SIB type memory operand of the form vm32{x,y,z} may identify a vector array of memory operands specified using SIB type memory addressing. In this example, the array of memory addresses is specified using a common base register, a constant scaling factor, and a vector index register containing individual elements, each of which is a 32-bit index value. The vector index register may be a 128-bit register (e.g., XMM) (vm32x), a 256-bit (e.g., YMM) register (vm32y), or a 512-bit (e.g., ZMM) register (vm32z). In another embodiment, an SIB type memory operand of the form vm64{x,y,z} may identify a vector array of memory operands specified using SIB type memory addressing. In this example, the array of memory addresses is specified using a common base register, a constant scaling factor, and a vector index register containing individual elements, each of which is a 64-bit index value. The vector index register may be a 128-bit register (e.g., XMM) (vm64x), a 256-bit (e.g., YMM) register (vm64y) or a 512-bit (e.g., ZMM) register (vm64z).

Detailed below are exemplary instruction formats, architectures, and systems that may be utilized for the above detailed instructions. For example, an exemplary pipeline supporting the instructions is detailed that includes circuitry to perform the methods detailed herein.

An instruction set includes one or more instruction formats. A given instruction format defines various fields (number of bits, location of bits) to specify, among other things, the operation to be performed (opcode) and the operand(s) on which that operation is to be performed. Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands.

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

VEX Instruction Format

VEX encoding allows instructions to have more than two operands, and allows SIMD vector registers to be longer than 158 bits. The use of a VEX prefix provides for three-operand (or more) syntax. For example, previous two-operand instructions performed operations such as A=A+B, which overwrites a source operand. The use of a VEX prefix enables operands to perform nondestructive operations such as A=B+C.

FIG. 15A illustrates an exemplary instruction format including a VEX prefix 1502, real opcode field 1530, Mod R/M byte 1540, SIB byte 1550, displacement field 1562, and IMM8 1572. FIG. 15B illustrates which fields from FIG. 15A make up a full opcode field 1574 and a base operation field 1541. FIG. 15C illustrates which fields from FIG. 15A make up a register index field 1544.

VEX Prefix (Bytes 0-2) 1502 is encoded in a three-byte form. The first byte is the Format Field 1590 (VEX Byte 0, bits [7:0]), which contains an explicit C4 byte value (the unique value used for distinguishing the C4 instruction format). The second-third bytes (VEX Bytes 1-2) include a number of bit fields providing specific capability. Specifically, REX field 1505 (VEX Byte 1, bits [7-5]) consists of a VEX.R bit field (VEX Byte 1, bit [7]—R), VEX.X bit field (VEX byte 1, bit [6]—X), and VEX.B bit field (VEX byte 1, bit[5]—B). Other fields of the instructions encode the lower three bits of the register indexes as is known in the art (rrr, xxx, and bbb), so that Rrrr, Xxxx, and Bbbb may be formed by adding VEX.R, VEX.X, and VEX.B. Opcode map field 1515 (VEX byte 1, bits [4:0]—mmmmm) includes content to encode an implied leading opcode byte. W Field 1564 (VEX byte 2, bit [7]—W)—is represented by the notation VEX.W, and provides different functions depending on the instruction. The role of VEX.vvvv 1520 (VEX Byte 2, bits [6:3]-vvvv) may include the following: 1) VEX.vvvv encodes the first source register operand, specified in inverted (1s complement) form and is valid for instructions with 2 or more source operands; 2) VEX.vvvv encodes the destination register operand, specified in 1s complement form for certain vector shifts; or 3) VEX.vvvv does not encode any operand, the field is reserved and should contain 1111b. If VEX.L 1568 Size field (VEX byte 2, bit [2]-L)=0, it indicates 158 bit vector; if VEX.L=1, it indicates 256 bit vector. Prefix encoding field 1525 (VEX byte 2, bits [1:0]-pp) provides additional bits for the base operation field 1541.

Real Opcode Field 1530 (Byte 3) is also known as the opcode byte. Part of the opcode is specified in this field.

MOD R/M Field 1540 (Byte 4) includes MOD field 1542 (bits [7-6]), Reg field 1544 (bits [5-3]), and R/M field 1546 (bits [2-0]). The role of Reg field 1544 may include the following: encoding either the destination register operand or a source register operand (the rrr of Rrrr), or be treated as an opcode extension and not used to encode any instruction operand. The role of R/M field 1546 may include the following: encoding the instruction operand that references a memory address, or encoding either the destination register operand or a source register operand.

Scale, Index, Base (SIB)—The content of Scale field 1550 (Byte 5) includes SS 1552 (bits [7-6]), which is used for memory address generation. The contents of SIB.xxx 1554 (bits [5-3]) and SIB.bbb 1556 (bits [2-0]) have been previously referred to with regard to the register indexes Xxxx and Bbbb.

The Displacement Field 1562 and the immediate field (IMM8) 1572 contain data.

Exemplary Register Architecture

FIG. 16 is a block diagram of a register architecture 1600 according to one embodiment of the invention. In the embodiment illustrated, there are 32 vector registers 1610 that are 512 bits wide; these registers are referenced as zmm0 through zmm31. The lower order 256 bits of the lower 19 zmm registers are overlaid on registers ymm0-15. The lower order 128 bits of the lower 19 zmm registers (the lower order 128 bits of the ymm registers) are overlaid on registers xmm0-15.

General-purpose registers 1625—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 1645, on which is aliased the MMX packed integer flat register file 1650—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures. Detailed herein are circuits (units) that comprise exemplary cores, processors, etc.

Exemplary Core Architectures

In-Order and Out-of-Order Core Block Diagram

FIG. 17A is a block diagram illustrating both an exemplary in-order pipeline and an exemplary register renaming, out-of-order issue/execution pipeline according to embodiments of the invention. FIG. 17B is a block diagram illustrating both an exemplary embodiment of an in-order architecture core and an exemplary register renaming, out-of-order issue/execution architecture core to be included in a processor according to embodiments of the invention. The solid lined boxes in FIGS. 17A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 17A, a processor pipeline 1700 includes a fetch stage 1702, a length decode stage 1704, a decode stage 1706, an allocation stage 1708, a renaming stage 1710, a scheduling (also known as a dispatch or issue) stage 1712, a register read/memory read stage 1714, an execute stage 1716, a write back/memory write stage 1718, an exception handling stage 1722, and a commit stage 1724.

FIG. 17B shows processor core 1790 including a front end unit 1730 coupled to an execution engine unit 1750, and both are coupled to a memory unit 1770. The core 1790 may be a reduced instruction set computing (RISC) core, a complex instruction set computing (CISC) core, a very long instruction word (VLIW) core, or a hybrid or alternative core type. As yet another option, the core 1790 may be a special-purpose core, such as, for example, a network or communication core, compression engine, coprocessor core, general purpose computing graphics processing unit (GPGPU) core, graphics core, or the like.

The front end unit 1730 includes a branch prediction unit 1732 coupled to an instruction cache unit 1734, which is coupled to an instruction translation lookaside buffer (TLB) 1736, which is coupled to an instruction fetch unit 1738, which is coupled to a decode unit 1740. The decode unit 1740 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1740 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1790 includes a microcode ROM or other medium that stores microcode for certain macroinstructions (e.g., in decode unit 1740 or otherwise within the front end unit 1730). The decode unit 1740 is coupled to a rename/allocator unit 1752 in the execution engine unit 1750.

The execution engine unit 1750 includes the rename/allocator unit 1752 coupled to a retirement unit 1754 and a set of one or more scheduler unit(s) 1756. The scheduler unit(s) 1756 represents any number of different schedulers, including reservations stations, central instruction window, etc. The scheduler unit(s) 1756 is coupled to the physical register file(s) unit(s) 1758. Each of the physical register file(s) units 1758 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1758 comprises a vector registers unit and a scalar registers unit. These register units may provide architectural vector registers, vector mask registers, and general purpose registers. The physical register file(s) unit 1758 is overlapped by the retirement unit 1754 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1754 and the physical register file(s) unit(s) 1758 are coupled to the execution cluster(s) 1760. The execution cluster(s) 1760 includes a set of one or more execution units 1762 and a set of one or more memory access units 1764. The execution units 1762 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1756, physical register file(s) unit(s) 1758, and execution cluster(s) 1760 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1764). It should also be understood that where separate pipelines are used, one or more of these pipelines may be out-of-order issue/execution and the rest in-order.

The set of memory access units 1764 is coupled to the memory unit 1770, which includes a data TLB unit 1772 coupled to a data cache unit 1774 coupled to a level 2 (L2) cache unit 1776. In one exemplary embodiment, the memory access units 1764 may include a load unit, a store address unit, and a store data unit, each of which is coupled to the data TLB unit 1772 in the memory unit 1770. The instruction cache unit 1734 is further coupled to a level 2 (L2) cache unit 1776 in the memory unit 1770. The L2 cache unit 1776 is coupled to one or more other levels of cache and eventually to a main memory.

By way of example, the exemplary register renaming, out-of-order issue/execution core architecture may implement the pipeline 1700 as follows: 1) the instruction fetch 1738 performs the fetch and length decoding stages 1702 and 1704; 2) the decode unit 1740 performs the decode stage 1706; 3) the rename/allocator unit 1752 performs the allocation stage 1708 and renaming stage 1710; 4) the scheduler unit(s) 1756 performs the schedule stage 1712; 5) the physical register file(s) unit(s) 1758 and the memory unit 1770 perform the register read/memory read stage 1714; the execution cluster 1760 perform the execute stage 1716; 6) the memory unit 1770 and the physical register file(s) unit(s) 1758 perform the write back/memory write stage 1718; 7) various units may be involved in the exception handling stage 1722; and 8) the retirement unit 1754 and the physical register file(s) unit(s) 1758 perform the commit stage 1724.

The core 1790 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1790 includes logic to support a packed data instruction set extension (e.g., AVX1, AVX2), thereby allowing the operations used by many multimedia applications to be performed using packed data.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1734/1774 and a shared L2 cache unit 1776, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 18B:
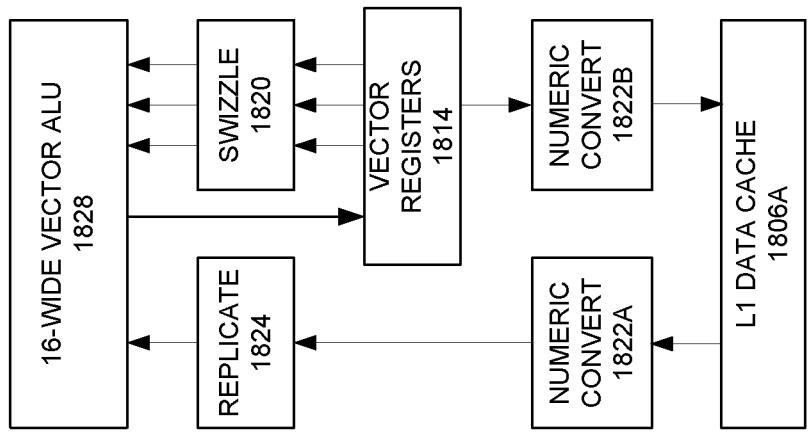
FIG. 18A-B illustrate a block diagram of a more specific exemplary in-order core architecture, which core would be one of several logic blocks (including other cores of the same type and/or different types) in a chip.
Figure 18A:
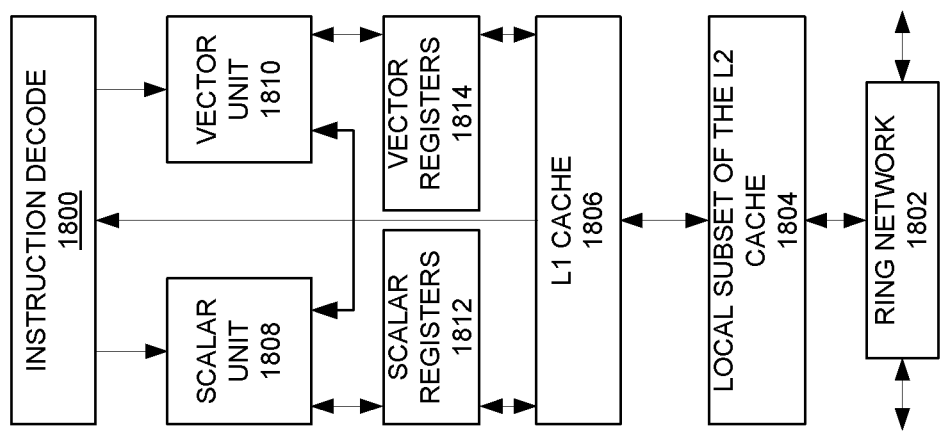

FIGS. 18A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 18A is a block diagram of a single processor core, along with its connection to the on-die interconnect network 1802 and with its local subset of the Level 2 (L2) cache 1804, according to embodiments of the invention. In one embodiment, an instruction decoder 1800 supports the x86 instruction set with a packed data instruction set extension. An L1 cache 1806 allows low-latency accesses to cache memory into the scalar and vector units. While in one embodiment (to simplify the design), a scalar unit 1808 and a vector unit 1810 use separate register sets (respectively, scalar registers 1812 and vector registers 1814) and data transferred between them is written to memory and then read back in from a level 1 (L1) cache 1806, alternative embodiments of the invention may use a different approach (e.g., use a single register set or include a communication path that allow data to be transferred between the two register files without being written and read back).

The local subset of the L2 cache 1804 is part of a global L2 cache that is divided into separate local subsets, one per processor core. Each processor core has a direct access path to its own local subset of the L2 cache 1804. Data read by a processor core is stored in its L2 cache subset 1804 and can be accessed quickly, in parallel with other processor cores accessing their own local L2 cache subsets. Data written by a processor core is stored in its own L2 cache subset 1804 and is flushed from other subsets, if necessary. The ring network ensures coherency for shared data. The ring network is bi-directional to allow agents such as processor cores, L2 caches and other logic blocks to communicate with each other within the chip. Each ring data-path is 1024-bits wide per direction in some embodiments.

FIG. 18B is an expanded view of part of the processor core in FIG. 18A according to embodiments of the invention. FIG. 18B includes an L1 data cache 1806A part of the L1 cache 1804, as well as more detail regarding the vector unit 1810 and the vector registers 1814. Specifically, the vector unit 1810 is a 19-wide vector processing unit (VPU) (see the 16-wide ALU 1828), which executes one or more of integer, single-precision float, and double-precision float instructions. The VPU supports swizzling the register inputs with swizzle unit 1820, numeric conversion with numeric convert units 1822A-B, and replication with replication unit 1824 on the memory input.

Processor with Integrated Memory Controller and Graphics

Figure 19:
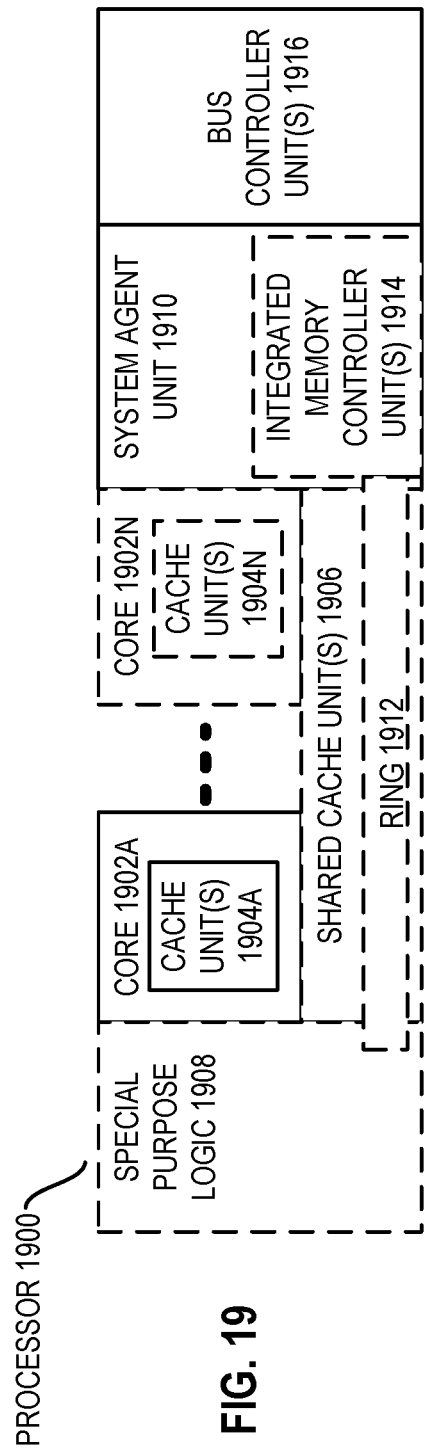
FIG. 19 is a block diagram of a processor that may have more than one core, may have an integrated memory controller, and may have integrated graphics according to embodiments of the invention.

FIG. 19 is a block diagram of a processor 1900 that may have more than one core, may have an integrated memory controller, and may have integrated graphics according to embodiments of the invention. The solid lined boxes in FIG. 19 illustrate a processor 1900 with a single core 1902A, a system agent 1910, a set of one or more bus controller units 1916, while the optional addition of the dashed lined boxes illustrates an alternative processor 1900 with multiple cores 1902A-N, a set of one or more integrated memory controller unit(s) 1914 in the system agent unit 1910, and special purpose logic 1908.

Thus, different implementations of the processor 1900 may include: 1) a CPU with the special purpose logic 1908 being integrated graphics and/or scientific (throughput) logic (which may include one or more cores), and the cores 1902A-N being one or more general purpose cores (e.g., general purpose in-order cores, general purpose out-of-order cores, a combination of the two); 2) a coprocessor with the cores 1902A-N being a large number of special purpose cores intended primarily for graphics and/or scientific (throughput); and 3) a coprocessor with the cores 1902A-N being a large number of general purpose in-order cores. Thus, the processor 1900 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1900 may be a part of and/or may be implemented on one or more substrates using any of a number of process technologies, such as, for example, BiCMOS, CMOS, or NMOS.

The memory hierarchy includes one or more levels of cache within the cores 1904A-N, a set or one or more shared cache units 1906, and external memory (not shown) coupled to the set of integrated memory controller units 1914. The set of shared cache units 1906 may include one or more mid-level caches, such as level 2 (L2), level 3 (L3), level 4 (L4), or other levels of cache, a last level cache (LLC), and/or combinations thereof. While in one embodiment a ring based interconnect unit 1912 interconnects the integrated graphics logic 1908, the set of shared cache units 1906, and the system agent unit 1910/integrated memory controller unit(s) 1914, alternative embodiments may use any number of well-known techniques for interconnecting such units. In one embodiment, coherency is maintained between one or more cache units 1906 and cores 1902-A-N.

In some embodiments, one or more of the cores 1902A-N are capable of multithreading. The system agent 1910 includes those components coordinating and operating cores 1902A-N. The system agent unit 1910 may include for example a power control unit (PCU) and a display unit. The PCU may be or include logic and components needed for regulating the power state of the cores 1902A-N and the integrated graphics logic 1908. The display unit is for driving one or more externally connected displays.

The cores 1902A-N may be homogenous or heterogeneous in terms of architecture instruction set; that is, two or more of the cores 1902A-N may be capable of execution the same instruction set, while others may be capable of executing only a subset of that instruction set or a different instruction set.

Exemplary Computer Architectures

FIGS. 20-23 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 20:
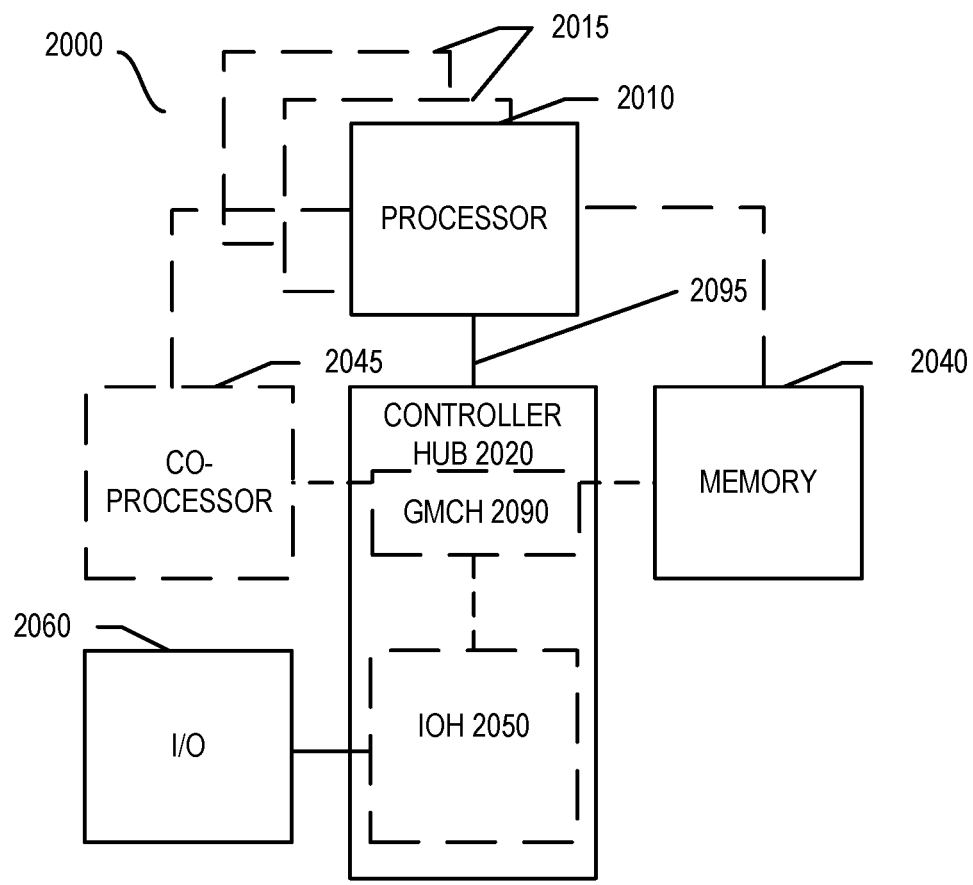
FIGS. 20-23 are block diagrams of exemplary computer architectures.

Referring now to FIG. 20, shown is a block diagram of a system 2000 in accordance with one embodiment of the present invention. The system 2000 may include one or more processors 2010, 2015, which are coupled to a controller hub 2020. In one embodiment, the controller hub 2020 includes a graphics memory controller hub (GMCH) 2090 and an Input/Output Hub (IOH) 2050 (which may be on separate chips); the GMCH 2090 includes memory and graphics controllers to which are coupled memory 2040 and a coprocessor 2045; the IOH 2050 is couples input/output (I/O) devices 2060 to the GMCH 2090. Alternatively, one or both of the memory and graphics controllers are integrated within the processor (as described herein), the memory 2040 and the coprocessor 2045 are coupled directly to the processor 2010, and the controller hub 2020 in a single chip with the IOH 2050.

The optional nature of additional processors 2015 is denoted in FIG. 20 with broken lines. Each processor 2010, 2015 may include one or more of the processing cores described herein and may be some version of the processor 1900.

The memory 2040 may be, for example, dynamic random access memory (DRAM), phase change memory (PCM), or a combination of the two. For at least one embodiment, the controller hub 2020 communicates with the processor(s) 2010, 2015 via a multi-drop bus, such as a frontside bus (FSB), point-to-point interface, or similar connection 2095.

In one embodiment, the coprocessor 2045 is a special-purpose processor, such as, for example, a high-throughput MIC processor, a network or communication processor, compression engine, graphics processor, GPGPU, embedded processor, or the like. In one embodiment, controller hub 2020 may include an integrated graphics accelerator.

There can be a variety of differences between the physical resources 2010, 20155 in terms of a spectrum of metrics of merit including architectural, microarchitectural, thermal, power consumption characteristics, and the like.

In one embodiment, the processor 2010 executes instructions that control data processing operations of a general type. Embedded within the instructions may be coprocessor instructions. The processor 2010 recognizes these coprocessor instructions as being of a type that should be executed by the attached coprocessor 2045. Accordingly, the processor 2010 issues these coprocessor instructions (or control signals representing coprocessor instructions) on a coprocessor bus or other interconnect, to coprocessor 2045. Coprocessor(s) 2045 accept and execute the received coprocessor instructions.

Figure 21:
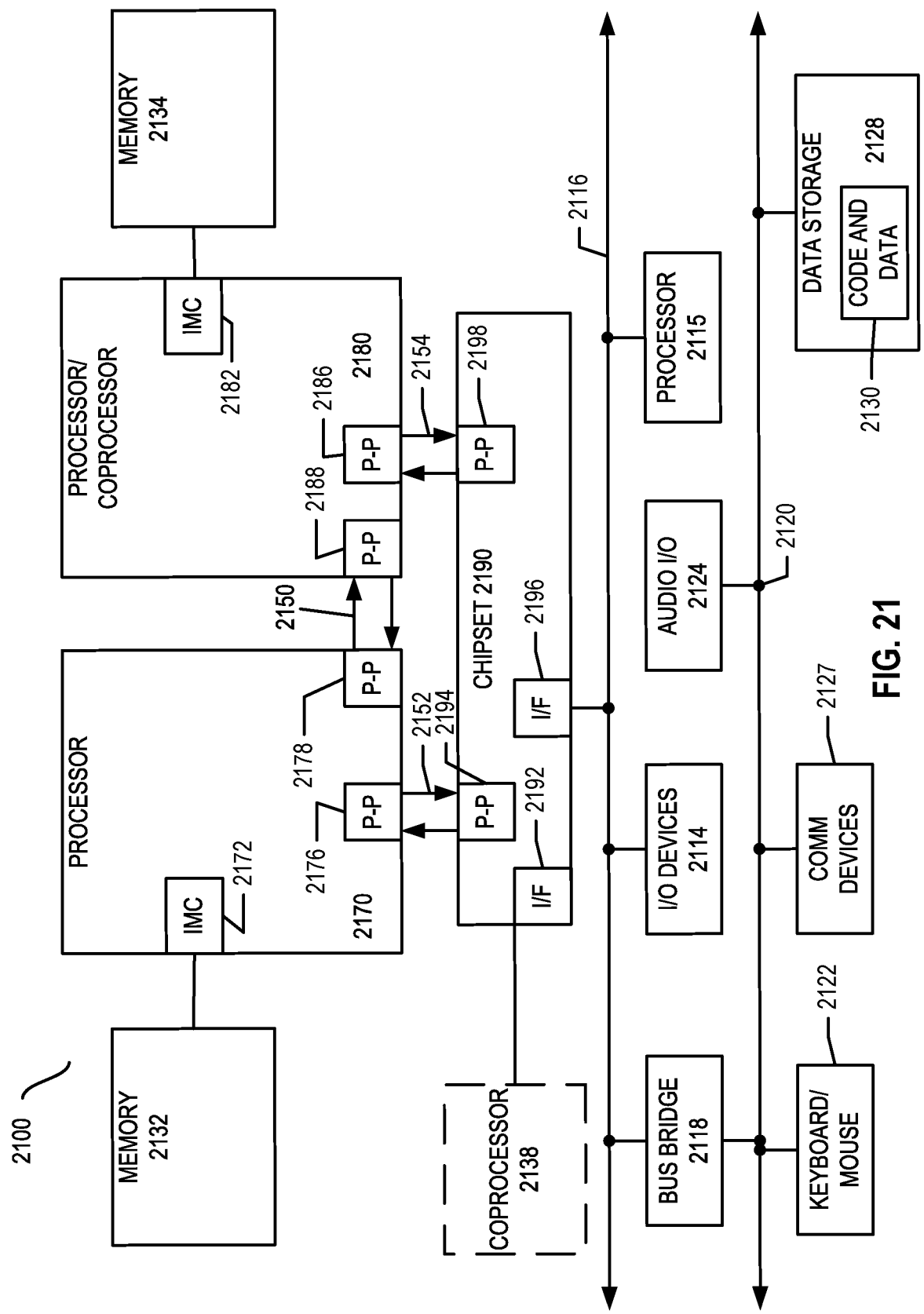

Referring now to FIG. 21, shown is a block diagram of a first more specific exemplary system 2100 in accordance with an embodiment of the present invention. As shown in FIG. 21, multiprocessor system 2100 is a point-to-point interconnect system, and includes a first processor 2170 and a second processor 2180 coupled via a point-to-point interconnect 2150. Each of processors 2170 and 2180 may be some version of the processor 1900. In one embodiment of the invention, processors 2170 and 2180 are respectively processors 2010 and 2015, while coprocessor 2138 is coprocessor 2045. In another embodiment, processors 2170 and 2180 are respectively processor 2010 coprocessor 2045.

Processors 2170 and 2180 are shown including integrated memory controller (IMC) units 2172 and 2182, respectively. Processor 2170 also includes as part of its bus controller units point-to-point (P-P) interfaces 2176 and 2178; similarly, second processor 2180 includes P-P interfaces 2186 and 2188. Processors 2170, 2180 may exchange information via a point-to-point (P-P) interface 2150 using P-P interface circuits 2178, 2188. As shown in FIG. 21, IMCs 2172 and 2182 couple the processors to respective memories, namely a memory 2132 and a memory 2134, which may be portions of main memory locally attached to the respective processors.

Processors 2170, 2180 may each exchange information with a chipset 2190 via individual P-P interfaces 2152, 2154 using point to point interface circuits 2176, 2194, 2186, 2198. Chipset 2190 may optionally exchange information with the coprocessor 2138 via a high-performance interface 2192. In one embodiment, the coprocessor 2138 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 2190 may be coupled to a first bus 2116 via an interface 2196. In one embodiment, first bus 2116 may be a Peripheral Component Interconnect (PCI) bus, or a bus such as a PCI Express bus or another I/O interconnect bus, although the scope of the present invention is not so limited.

As shown in FIG. 21, various I/O devices 2114 may be coupled to first bus 2116, along with a bus bridge 2118 which couples first bus 2116 to a second bus 2120. In one embodiment, one or more additional processor(s) 2115, such as coprocessors, high-throughput MIC processors, GPGPU's, accelerators (such as, e.g., graphics accelerators or digital signal processing (DSP) units), field programmable gate arrays, or any other processor, are coupled to first bus 2116. In one embodiment, second bus 2120 may be a low pin count (LPC) bus. Various devices may be coupled to a second bus 2120 including, for example, a keyboard and/or mouse 2122, communication devices 2127 and a storage unit 2128 such as a disk drive or other mass storage device which may include instructions/code and data 2130, in one embodiment. Further, an audio I/O 2124 may be coupled to the second bus 2116. Note that other architectures are possible. For example, instead of the point-to-point architecture of FIG. 21, a system may implement a multi-drop bus or other such architecture.

Figure 22:
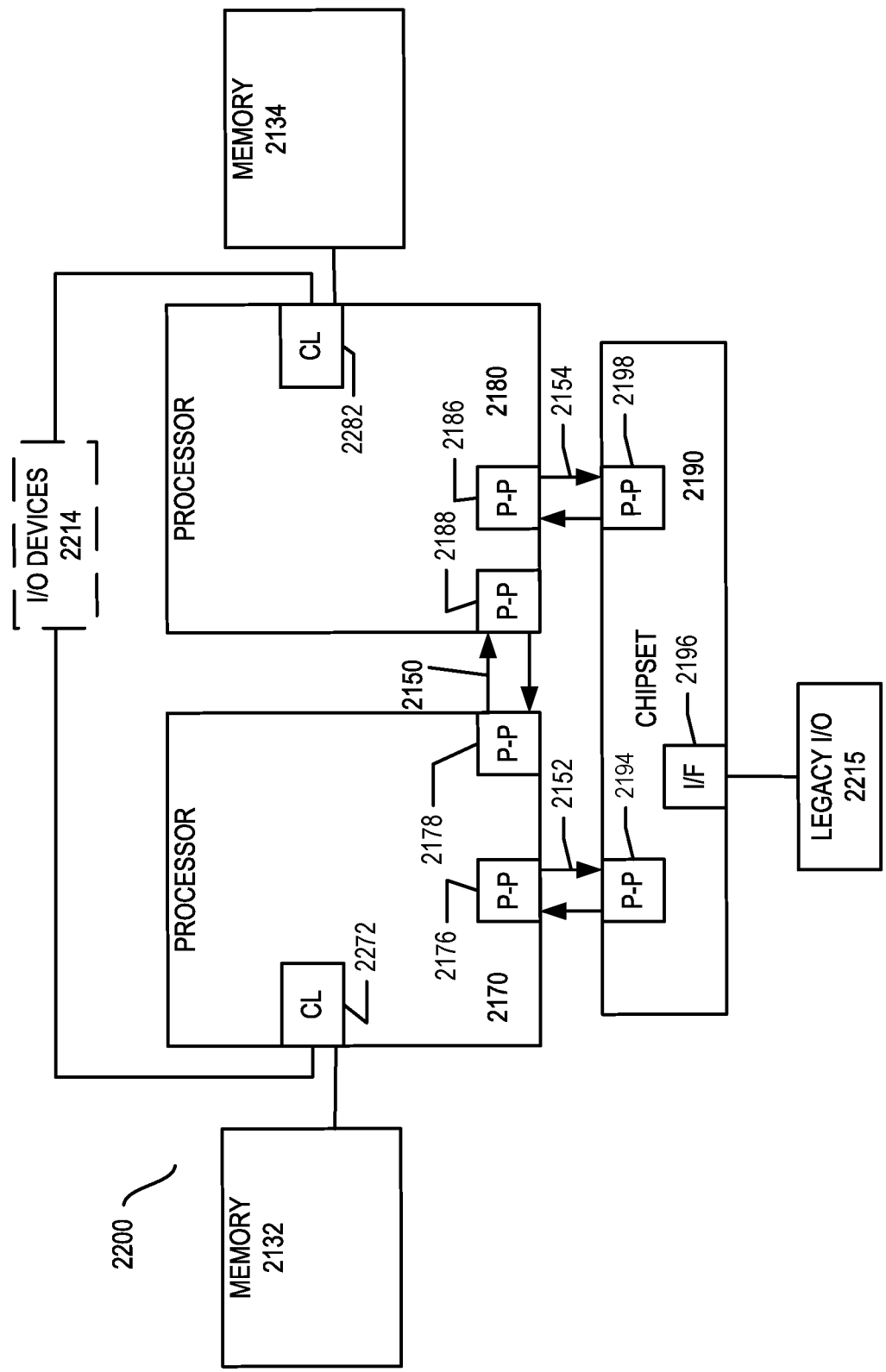

Referring now to FIG. 22, shown is a block diagram of a second more specific exemplary system 2200 in accordance with an embodiment of the present invention. Like elements in FIGS. 21 and 22 bear like reference numerals, and certain aspects of FIG. 21 have been omitted from FIG. 22 in order to avoid obscuring other aspects of FIG. 22.

FIG. 22 illustrates that the processors 2170, 2180 may include integrated memory and I/O control logic ("CL") 2272 and 2282, respectively. Thus, the CL 2272, 2282 include integrated memory controller units and include I/O control logic. FIG. 22 illustrates that not only are the memories 2132, 2134 coupled to the CL 2172, 2182, but also that I/O devices 2214 are also coupled to the control logic 2172, 2182. Legacy I/O devices 2215 are coupled to the chipset 2190.

Figure 23:
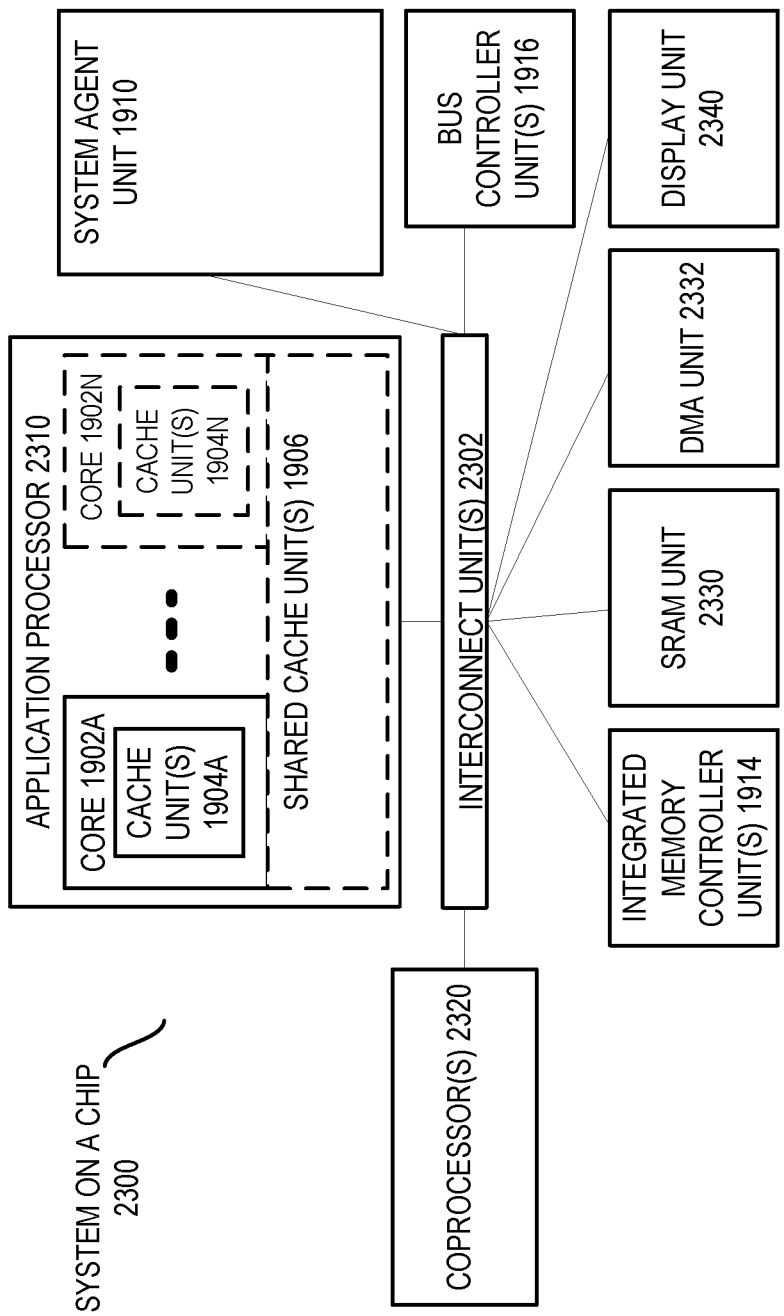

Referring now to FIG. 23, shown is a block diagram of a SoC 2300 in accordance with an embodiment of the present invention. Similar elements in FIG. 19 bear like reference numerals. Also, dashed lined boxes are optional features on more advanced SoCs. In FIG. 23, an interconnect unit(s) 2302 is coupled to: an application processor 2310 which includes a set of one or more cores 232A-N, cache units 1904A-N, and shared cache unit(s) 1906; a system agent unit 1910; a bus controller unit(s) 1916; an integrated memory controller unit(s) 1914; a set or one or more coprocessors 2320 which may include integrated graphics logic, an image processor, an audio processor, and a video processor; an static random access memory (SRAM) unit 2330; a direct memory access (DMA) unit 2332; and a display unit 2340 for coupling to one or more external displays. In one embodiment, the coprocessor(s) 2320 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 2130 illustrated in FIG. 21, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMS) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 24 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 24 shows a program in a high level language 2402 may be compiled using an first compiler 2404 to generate a first binary code (e.g., x86) 2406 that may be natively executed by a processor with at least one first instruction set core 2416. In some embodiments, the processor with at least one first instruction set core 2416 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The first compiler 2404 represents a compiler that is operable to generate binary code of the first instruction set 2406 (e.g., object code) that can, with or without additional linkage processing, be executed on the processor with at least one first instruction set core 2416. Similarly, FIG. 24 shows the program in the high level language 2402 may be compiled using an alternative instruction set compiler 2408 to generate alternative instruction set binary code 2410 that may be natively executed by a processor without at least one first instruction set core 2414 (e.g., a processor with cores that execute the MIPS instruction set of MIPS Technologies of Sunnyvale, Calif. and/or that execute the ARM instruction set of ARM Holdings of Sunnyvale, Calif.). The instruction converter 2412 is used to convert the first binary code 2406 into code that may be natively executed by the processor without an first instruction set core 2414. This converted code is not likely to be the same as the alternative instruction set binary code 2410 because an instruction converter capable of this is difficult to make; however, the converted code will accomplish the general operation and be made up of instructions from the alternative instruction set. Thus, the instruction converter 2412 represents software, firmware, hardware, or a combination thereof that, through emulation, simulation or any other process, allows a processor or other electronic device that does not have a first instruction set processor or core to execute the first binary code 2406.

The following paragraphs detail examples of embodiments.

Example 1

A processor comprising: decode circuitry to decode an instruction having fields for an opcode, a packed data source operand identifier, and a packed data destination operand identifier, and execution circuitry to execute the decoded instruction to convert a data element from a least significant packed data element position of the identified packed data source operand from a fixed-point representation to a floating point representation, store the floating point representation into a 32-bit least significant packed data element position of the identified packed data destination operand, and zero all remaining packed data elements of the identified packed data destination operand.

Example 2

The processor of example 1, wherein the opcode is to indicate data elements of the identified packed data source are unsigned and a size of the packed data elements of the identified packed data source.

Example 3

The processor of example 2, wherein the size of the packed data elements of the identified packed data source is 16-bit, and the execution circuitry is further to: zero extend the data element from the least significant packed data element position of the identified packed data source operand to 32 bits, calculate an absolute value of the zero extended data element from the least significant packed data element position of the identified packed data source operand, set a sign for the floating point representation to zero, determine a leading one position of the absolute value of the zero extended data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the zero extended data element using values from the calculated least significant bit position to the calculated most significant bit position, and when the leading one position is not greater than 23, calculate a number of padding bits, and set a fractional as an absolute value of the zero extended data element using values from zero to the calculated most significant bit position concatenated with the number of calculated padding bits, and concatenate three zeros with the leading one position value and add 127 to calculate an exponent, store the sign, exponent, and fractional.

Example 4

The processor of example 2, wherein the size of the packed data elements of the identified packed data source is 32-bit, and the execution circuitry is further to: calculate an absolute value of the zero extended data element from the least significant packed data element position of the identified packed data source operand, set a sign for the floating point representation to zero, determine a leading one position of the absolute value of the data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

Example 5

The processor of example 1, wherein the opcode is to indicate data elements of the identified packed data source are signed and a size of the packed data elements of the identified packed data source.

Example 6

The processor of example 5, wherein the size of the packed data elements of the identified packed data source is 16-bit, and the execution circuitry is further to: sign extend the data element from the least significant packed data element position of the identified packed data source operand to 32 bits, calculate an absolute value of the sign extended data element from the least significant packed data element position of the identified packed data source operand, set a sign for the floating point representation to one, determine a leading one position of the absolute value of the sign extended data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the sign extended data element using values from the calculated least significant bit position to the calculated most significant bit position, and when the leading one position is not greater than 23, calculate a number of padding bits, and set a fractional as an absolute value of the sign extended data element using values from zero to the calculated most significant bit position concatenated with the number of calculated padding bits, and concatenate three zeros with the leading one position value and add 127 to calculate an exponent, store the sign, exponent, and fractional.

Example 7

The processor of example 5, wherein the size of the packed data elements of the identified packed data source is 32-bit, and the execution circuitry is further to: calculate an absolute value of the sign extended data element from the least significant packed data element position of the identified packed data source operand, set a sign for the floating point representation to one, determine a leading one position of the absolute value of the data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

Example 8

A method comprising: decoding an instruction having fields for an opcode, a packed data source operand identifier, and a packed data destination operand identifier, and executing the decoded instruction to convert a data element from a least significant packed data element position of the identified packed data source operand from a fixed-point representation to a floating point representation, store the floating point representation into a 32-bit least significant packed data element position of the identified packed data destination operand, and zero all remaining packed data elements of the identified packed data destination operand.

Example 9

The method of example 8, wherein the opcode is to indicate data elements of the identified packed data source are unsigned and a size of the packed data elements of the identified packed data source.

Example 10

The method of example 9, wherein the size of the packed data elements of the identified packed data source is 16-bit, and the executing is further to: zero extend the data element from the least significant packed data element position of the identified packed data source operand to 32 bits, calculate an absolute value of the zero extended data element from the least significant packed data element position of the identified packed data source operand, set a sign for the floating point representation to zero, determine a leading one position of the absolute value of the zero extended data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the zero extended data element using values from the calculated least significant bit position to the calculated most significant bit position, and when the leading one position is not greater than 23, calculate a number of padding bits, and set a fractional as an absolute value of the zero extended data element using values from zero to the calculated most significant bit position concatenated with the number of calculated padding bits, and concatenate three zeros with the leading one position value and add 127 to calculate an exponent, store the sign, exponent, and fractional.

Example 11

The method of example 9, wherein the size of the packed data elements of the identified packed data source is 32-bit, and the executing is further to: calculate an absolute value of the zero extended data element from the least significant packed data element position of the identified packed data source operand, set a sign for the floating point representation to zero, determine a leading one position of the absolute value of the data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

Example 12

The method of example 8, wherein the opcode is to indicate data elements of the identified packed data source are signed and a size of the packed data elements of the identified packed data source.

Example 13

The method of example 12, wherein the size of the packed data elements of the identified packed data source is 16-bit, and the executing is further to: sign extend the data element from the least significant packed data element position of the identified packed data source operand to 32 bits, calculate an absolute value of the sign extended data element from the least significant packed data element position of the identified packed data source operand, set a sign for the floating point representation to one, determine a leading one position of the absolute value of the sign extended data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the sign extended data element using values from the calculated least significant bit position to the calculated most significant bit position, and when the leading one position is not greater than 23, calculate a number of padding bits, and set a fractional as an absolute value of the sign extended data element using values from zero to the calculated most significant bit position concatenated with the number of calculated padding bits, and concatenate three zeros with the leading one position value and add 127 to calculate an exponent, store the sign, exponent, and fractional.

Example 14

The method of example 12, wherein the size of the packed data elements of the identified packed data source is 32-bit, and the executing is further to: calculate an absolute value of the sign extended data element from the least significant packed data element position of the identified packed data source operand, set a sign for the floating point representation to one, determine a leading one position of the absolute value of the data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

Example 15

A non-transitory machine-readable medium storing an instruction which is to cause a processor to perform a method comprising: decoding an instruction having fields for an opcode, a packed data source operand identifier, and a packed data destination operand identifier, and executing the decoded instruction to convert a data element from a least significant packed data element position of the identified packed data source operand from a fixed-point representation to a floating point representation, store the floating point representation into a 32-bit least significant packed data element position of the identified packed data destination operand, and zero all remaining packed data elements of the identified packed data destination operand.

Example 16

The non-transitory machine-readable medium of example 15, wherein the opcode is to indicate data elements of the identified packed data source are unsigned and a size of the packed data elements of the identified packed data source.

Example 17

The non-transitory machine-readable medium of example 16, wherein the size of the packed data elements of the identified packed data source is 16-bit, and the executing is further to: zero extend the data element from the least significant packed data element position of the identified packed data source operand to 32 bits, calculate an absolute value of the zero extended data element from the least significant packed data element position of the identified packed data source operand, set a sign for the floating point representation to zero, determine a leading one position of the absolute value of the zero extended data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the zero extended data element using values from the calculated least significant bit position to the calculated most significant bit position, and when the leading one position is not greater than 23, calculate a number of padding bits, and set a fractional as an absolute value of the zero extended data element using values from zero to the calculated most significant bit position concatenated with the number of calculated padding bits, and concatenate three zeros with the leading one position value and add 127 to calculate an exponent, store the sign, exponent, and fractional.

Example 18

The non-transitory machine-readable medium of example 16, wherein the size of the packed data elements of the identified packed data source is 32-bit, and the executing is further to: calculate an absolute value of the zero extended data element from the least significant packed data element position of the identified packed data source operand, set a sign for the floating point representation to zero, determine a leading one position of the absolute value of the data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

Example 19

The non-transitory machine-readable medium of example 15, wherein the opcode is to indicate data elements of the identified packed data source are signed and a size of the packed data elements of the identified packed data source.

Example 20

The non-transitory machine-readable medium of example 19, wherein the size of the packed data elements of the identified packed data source is 16-bit, and the executing is further to: sign extend the data element from the least significant packed data element position of the identified packed data source operand to 32 bits, calculate an absolute value of the sign extended data element from the least significant packed data element position of the identified packed data source operand, set a sign for the floating point representation to one, determine a leading one position of the absolute value of the sign extended data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the sign extended data element using values from the calculated least significant bit position to the calculated most significant bit position, and when the leading one position is not greater than 23, calculate a number of padding bits, and set a fractional as an absolute value of the sign extended data element using values from zero to the calculated most significant bit position concatenated with the number of calculated padding bits, and concatenate three zeros with the leading one position value and add 127 to calculate an exponent, store the sign, exponent, and fractional.

Example 21

The non-transitory machine-readable medium of example 19, wherein the size of the packed data elements of the identified packed data source is 32-bit, and the executing is further to: calculate an absolute value of the sign extended data element from the least significant packed data element position of the identified packed data source operand, set a sign for the floating point representation to one, determine a leading one position of the absolute value of the data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most signifi-cant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

Example 22

An apparatus comprising: decode means for decoding an instruction having fields for an opcode, a packed data source operand identifier, and a packed data destination operand identifier, and execution means for executing the decoded instruction to convert a data element from a least significant packed data element position of the identified packed data source operand from a fixed-point representation to a floating point representation, store the floating point representation into a 32-bit least significant packed data element position of the identified packed data destination operand, and zero all remaining packed data elements of the identified packed data destination operand.

Example 23

The apparatus of example 22, wherein the opcode is to indicate data elements of the identified packed data source are unsigned and a size of the packed data elements of the identified packed data source.

Example 24

The apparatus of example 23, wherein the size of the packed data elements of the identified packed data source is 16-bit, and the execution means is further to: zero extend the data element from the least significant packed data element position of the identified packed data source operand to 32 bits, calculate an absolute value of the zero extended data element from the least significant packed data element position of the identified packed data source operand, set a sign for the floating point representation to zero, determine a leading one position of the absolute value of the zero extended data element from the least significant packed data element position of the identified packed data source oper-and, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the zero extended data element using values from the calculated least significant bit position to the calculated most significant bit position, and when the leading one position is not greater than 23, calculate a number of padding bits, and set a fractional as an absolute value of the zero extended data element using values from zero to the calculated most significant bit position concatenated with the number of calculated padding bits, and concatenate three zeros with the leading one position value and add 127 to calculate an exponent, store the sign, exponent, and fractional.

Example 25

The apparatus of example 23, wherein the size of the packed data elements of the identified packed data source is 32-bit, and the execution means is further to: calculate an absolute value of the zero extended data element from the least significant packed data element position of the identified packed data source operand, set a sign for the floating point representation to zero, determine a leading one position of the absolute value of the data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

Example 26

The apparatus of example 22, wherein the opcode is to indicate data elements of the identified packed data source are signed and a size of the packed data elements of the identified packed data source.

Example 27

The apparatus of example 26, wherein the size of the packed data elements of the identified packed data source is 16-bit, and the execution means is further to: sign extend the data element from the least significant packed data element position of the identified packed data source operand to 32 bits, calculate an absolute value of the sign extended data element from the least significant packed data element position of the identified packed data source operand, set a sign for the floating point representation to one, determine a leading one position of the absolute value of the sign extended data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the sign extended data element using values from the calculated least significant bit position to the calculated most significant bit position, and when the leading one position is not greater than 23, calculate a number of padding bits, and set a fractional as an absolute value of the sign extended data element using values from zero to the calculated most significant bit position concatenated with the number of calculated padding bits, and concatenate three zeros with the leading one position value and add 127 to calculate an exponent, store the sign, exponent, and fractional.

Example 28

The apparatus of example 26, wherein the size of the packed data elements of the identified packed data source is 32-bit, and the execution means is further to: calculate an absolute value of the sign extended data element from the least significant packed data element position of the identified packed data source operand, set a sign for the floating point representation to one, determine a leading one position of the absolute value of the data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

We claim:

1. An apparatus comprising:
  memory to store an instruction;
  a processor coupled to the memory, the processor to at least include:
    decode circuitry to decode the instruction having fields for an opcode, a packed data source operand identifier, and a packed data destination operand identifier, and
    execution circuitry to execute the decoded instruction according to the opcode to convert a data element from a packed data element position of the identified packed data source operand from a fixed-point representation to a floating point representation, store the floating point representation into a packed data element position of the identified packed data destination operand, and zero all remaining packed data elements of the identified packed data destination operand.

2. The apparatus of claim 1, wherein the opcode is to indicate data elements of the identified packed data source are unsigned and a size of the packed data elements of the identified packed data source.

3. The apparatus of claim 2, wherein the size of the packed data elements of the identified packed data source is 16-bit, and the execution circuitry is further to:
  zero extend the data element from the packed data element position of the identified packed data source operand to 32 bits,
  calculate an absolute value of the zero extended data element from packed data element position of the identified packed data source operand,
  set a sign for the floating point representation to zero,
  determine a leading one position of the absolute value of the zero extended data element from the packed data element position of the identified packed data source operand,
  when the leading one position is null, set a fractional value to zero for floating point representation,
  when the leading one position is not null, subtract a 1 from the determined leading one position to set a most significant bit position, determine when the leading one position is greater than 23,
> when the leading one position is greater than 23,
>> calculate a least significant bit position, and
>> set a fractional as an absolute value of the zero extended data element using values from the calculated least significant bit position to the calculated most significant bit position, and
> when the leading one position is not greater than 23,
>> calculate a number of padding bits, and
>> set a fractional as an absolute value of the zero extended data element using values from zero to the calculated most significant bit position concatenated with the number of calculated padding bits, and concatenate three zeros with the leading one position value and add 127 to calculate an exponent, store the sign, exponent, and fractional.

4. The apparatus of claim 2, wherein the size of the packed data elements of the identified packed data source is 32-bit, and the execution circuitry is further to:

calculate an absolute value of the zero extended data element from the packed data element position of the identified packed data source operand, set a sign for the floating point representation to zero, determine a leading one position of the absolute value of the data element from the packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23,
> when the leading one position is greater than 23,
>> calculate a least significant bit position, and
>> set a fractional as an absolute value of the data element using values from the calculated least significant bit position to the calculated most significant bit position, and
> when the leading one position is not greater than 23,
>> calculate a number of padding bits, and
>> set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

5. The apparatus of claim 1, wherein the opcode is to indicate data elements of the identified packed data source are signed and a size of the packed data elements of the identified packed data source.

6. The apparatus of claim 5, wherein the size of the packed data elements of the identified packed data source is 16-bit, and the execution circuitry is further to:

sign extend the data element from the packed data element position of the identified packed data source operand to 32 bits, calculate an absolute value of the sign extended data element from the packed data element position of the identified packed data source operand, set a sign for the floating point representation to one, determine a leading one position of the absolute value of the sign extended data element from the least significant packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23,
> when the leading one position is greater than 23,
>> calculate a least significant bit position, and
>> set a fractional as an absolute value of the sign extended data element using values from the calculated least significant bit position to the calculated most significant bit position, and
> when the leading one position is not greater than 23,
>> calculate a number of padding bits, and
>> set a fractional as an absolute value of the sign extended data element using values from zero to the calculated most significant bit position concatenated with the number of calculated padding bits, and concatenate three zeros with the leading one position value and add 127 to calculate an exponent, store the sign, exponent, and fractional.

7. The apparatus of claim 5, wherein the size of the packed data elements of the identified packed data source is 32-bit, and the execution circuitry is further to:

calculate an absolute value of the sign extended data element from the packed data element position of the identified packed data source operand, set a sign for the floating point representation to one, determine a leading one position of the absolute value of the data element from the packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23,
> when the leading one position is greater than 23,
>> calculate a least significant bit position, and
>> set a fractional as an absolute value of the data element using values from the calculated least significant bit position to the calculated most significant bit position, and
> when the leading one position is not greater than 23,
>> calculate a number of padding bits, and
>> set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

8. A method comprising:

decoding an instruction having fields for an opcode, a packed data source operand identifier, and a packed data destination operand identifier; and executing the decoded instruction according to the opcode to convert a data element from a packed data element position of the identified packed data source operand from a fixed-point representation to a floating point representation, store the floating point representation into a data element position of the identified packed data destination operand, and zero all remaining packed data elements of the identified packed data destination operand.

9. The method of claim 8, wherein the opcode is to indicate data elements of the identified packed data source are unsigned and a size of the packed data elements of the identified packed data source.

10. The method of claim 9, wherein the size of the packed data elements of the identified packed data source is 16-bit, and the executing is further to:
zero extend the data element from the packed data element position of the identified packed data source operand to 32 bits,
calculate an absolute value of the zero extended data element from the packed data element position of the identified packed data source operand,
set a sign for the floating point representation to zero,
determine a leading one position of the absolute value of the zero extended data element from the packed data element position of the identified packed data source operand,
when the leading one position is null, set a fractional value to zero for floating point representation,
when the leading one position is not null, subtract a 1 from the determined leading one position to set a most significant bit position,
determine when the leading one position is greater than 23,
when the leading one position is greater than 23, calculate a least significant bit position, and
set a fractional as an absolute value of the zero extended data element using values from the calculated least significant bit position to the calculated most significant bit position, and
when the leading one position is not greater than 23, calculate a number of padding bits, and
set a fractional as an absolute value of the zero extended data element using values from zero to the calculated most significant bit position concatenated with the number of calculated padding bits, and
concatenate three zeros with the leading one position value and add 127 to calculate an exponent,
store the sign, exponent, and fractional.

11. The method of claim 9, wherein the size of the packed data elements of the identified packed data source is 32-bit, and the executing is further to:
calculate an absolute value of the zero extended data element from the packed data element position of the identified packed data source operand,
set a sign for the floating point representation to zero,
determine a leading one position of the absolute value of the data element from the packed data element position of the identified packed data source operand,
when the leading one position is null, set a fractional value to zero for floating point representation,
when the leading one position is not null, subtract a 1 from the determined leading one position to set a most significant bit position,
determine when the leading one position is greater than 23,
when the leading one position is greater than 23, calculate a least significant bit position, and
set a fractional as an absolute value of the data element using values from the calculated least significant bit position to the calculated most significant bit position, and
when the leading one position is not greater than 23, calculate a number of padding bits, and
set a fractional as an absolute value of the data element using values from zero to the calculated most significant bit position concatenated with the number of calculated padding bits, and
concatenate three zeros with the leading one position value and add 127 to calculate an exponent,
store the sign, exponent, and fractional.

12. The method of claim 8, wherein the opcode is to indicate data elements of the identified packed data source are signed and a size of the packed data elements of the identified packed data source.

13. The method of claim 12, wherein the size of the packed data elements of the identified packed data source is 16-bit, and the executing is further to:
sign extend the data element from the packed data element position of the identified packed data source operand to 32 bits,
calculate an absolute value of the sign extended data element from the packed data element position of the identified packed data source operand,
set a sign for the floating point representation to one,
determine a leading one position of the absolute value of the sign extended data element from the packed data element position of the identified packed data source operand,
when the leading one position is null, set a fractional value to zero for floating point representation,
when the leading one position is not null, subtract a 1 from the determined leading one position to set a most significant bit position,
determine when the leading one position is greater than 23,
when the leading one position is greater than 23, calculate a least significant bit position, and
set a fractional as an absolute value of the sign extended data element using values from the calculated least significant bit position to the calculated most significant bit position, and
when the leading one position is not greater than 23, calculate a number of padding bits, and
set a fractional as an absolute value of the sign extended data element using values from zero to the calculated most significant bit position concatenated with the number of calculated padding bits, and
concatenate three zeros with the leading one position value and add 127 to calculate an exponent,
store the sign, exponent, and fractional.

14. The method of claim 12, wherein the size of the packed data elements of the identified packed data source is 32-bit, and the executing is further to:
calculate an absolute value of the sign extended data element from the packed data element position of the identified packed data source operand,
set a sign for the floating point representation to one,
determine a leading one position of the absolute value of the data element from the packed data element position of the identified packed data source operand,
when the leading one position is null, set a fractional value to zero for floating point representation,
when the leading one position is not null, subtract a 1 from the determined leading one position to set a most significant bit position,
determine when the leading one position is greater than 23, when the leading one position is greater than 23,
    calculate a least significant bit position, and
    set a fractional as an absolute value of the data element using values from the calculated least significant bit position to the calculated most significant bit position, and
when the leading one position is not greater than 23,
    calculate a number of padding bits, and
    set a fractional as an absolute value of the data element using values from zero to the calculated most significant bit position concatenated with the number of calculated padding bits, and
concatenate three zeros with the leading one position value and add 127 to calculate an exponent,
store the sign, exponent, and fractional.

15. A non-transitory machine-readable medium storing an instruction which is to cause a processor to perform a method comprising:
decoding the instruction having fields for an opcode, a packed data source operand identifier, and a packed data destination operand identifier; and
executing the decoded instruction according to the opcode to convert a data element from a packed data element position of the identified packed data source operand from a fixed-point representation to a floating point representation, store the floating point representation into a 32-bit packed data element position of the identified packed data destination operand, and zero all remaining packed data elements of the identified packed data destination operand.

16. The non-transitory machine-readable medium of claim 15, wherein the opcode is to indicate data elements of the identified packed data source are unsigned and a size of the packed data elements of the identified packed data source.

17. The non-transitory machine-readable medium of claim 16, wherein the size of the packed data elements of the identified packed data source is 16-bit, and the executing is further to:
zero extend the data element from the packed data element position of the identified packed data source operand to 32 bits,
calculate an absolute value of the zero extended data element from the packed data element position of the identified packed data source operand,
set a sign for the floating point representation to zero,
determine a leading one position of the absolute value of the zero extended data element from the packed data element position of the identified packed data source operand,
when the leading one position is null, set a fractional value to zero for floating point representation,
when the leading one position is not null, subtract a 1 from the determined leading one position to set a most significant bit position,
determine when the leading one position is greater than 23,
    when the leading one position is greater than 23,
        calculate a least significant bit position, and
        set a fractional as an absolute value of the zero extended data element using values from the calculated least significant bit position to the calculated most significant bit position, and
    when the leading one position is not greater than 23,
        calculate a number of padding bits, and
        set a fractional as an absolute value of the zero extended data element using values from zero to the calculated most significant bit position concatenated with the number of calculated padding bits, and
concatenate three zeros with the leading one position value and add 127 to calculate an exponent,
store the sign, exponent, and fractional.

18. The non-transitory machine-readable medium of claim 16, wherein the size of the packed data elements of the identified packed data source is 32-bit, and the executing is further to:
calculate an absolute value of the zero extended data element from the packed data element position of the identified packed data source operand,
set a sign for the floating point representation to zero,
determine a leading one position of the absolute value of the data element from the packed data element position of the identified packed data source operand,
when the leading one position is null, set a fractional value to zero for floating point representation,
when the leading one position is not null, subtract a 1 from the determined leading one position to set a most significant bit position,
determine when the leading one position is greater than 23,
    when the leading one position is greater than 23,
        calculate a least significant bit position, and
        set a fractional as an absolute value of the data element using values from the calculated least significant bit position to the calculated most significant bit position, and
    when the leading one position is not greater than 23,
        calculate a number of padding bits, and
        set a fractional as an absolute value of the data element using values from zero to the calculated most significant bit position concatenated with the number of calculated padding bits, and
concatenate three zeros with the leading one position value and add 127 to calculate an exponent,
store the sign, exponent, and fractional.

19. The non-transitory machine-readable medium of claim 15, wherein the opcode is to indicate data elements of the identified packed data source are signed and a size of the packed data elements of the identified packed data source.

20. The non-transitory machine-readable medium of claim 19, wherein the size of the packed data elements of the identified packed data source is 16-bit, and the executing is further to:
sign extend the data element from the packed data element position of the identified packed data source operand to 32 bits,
calculate an absolute value of the sign extended data element from the packed data element position of the identified packed data source operand,
set a sign for the floating point representation to one,
determine a leading one position of the absolute value of the sign extended data element from the packed data element position of the identified packed data source operand,
when the leading one position is null, set a fractional value to zero for floating point representation,
when the leading one position is not null, subtract a 1 from the determined leading one position to set a most significant bit position,
determine when the leading one position is greater than 23,
    when the leading one position is greater than 23,
        calculate a least significant bit position, and set a fractional as an absolute value of the sign extended data element using values from the calculated least significant bit position to the calculated most significant bit position, and when the leading one position is not greater than 23, calculate a number of padding bits, and set a fractional as an absolute value of the sign extended data element using values from zero to the calculated most significant bit position concatenated with the number of calculated padding bits, and concatenate three zeros with the leading one position value and add 127 to calculate an exponent, store the sign, exponent, and fractional.

21. The non-transitory machine-readable medium of claim 19, wherein the size of the packed data elements of the identified packed data source is 32-bit, and the executing is further to:

calculate an absolute value of the sign extended data element from the packed data element position of the identified packed data source operand, set a sign for the floating point representation to one, determine a leading one position of the absolute value of the data element from the packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

22. An apparatus comprising:
memory to store an instruction;
a processor coupled to the memory, the processor to at least include:
decode means for decoding the instruction having fields for an opcode, a packed data source operand identifier, and a packed data destination operand identifier; and
execution means for executing the decoded instruction according to the opcode to convert a data element from a packed data element position of the identified packed data source operand from a fixed-point representation to a floating point representation, store the floating point representation into a packed data element position of the identified packed data destination operand, and zero all remaining packed data elements of the identified packed data destination operand.

23. The apparatus of claim 22, wherein the opcode is to indicate data elements of the identified packed data source are unsigned and a size of the packed data elements of the identified packed data source.

24. The apparatus of claim 23, wherein the size of the packed data elements of the identified packed data source is 16-bit, and the execution means is further to:

zero extend the data element from the packed data element position of the identified packed data source operand to 32 bits, calculate an absolute value of the zero extended data element from the packed data element position of the identified packed data source operand, set a sign for the floating point representation to zero, determine a leading one position of the absolute value of the zero extended data element from the packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the zero extended data element using values from the calculated least significant bit position to the calculated most significant bit position, and when the leading one position is not greater than 23, calculate a number of padding bits, and set a fractional as an absolute value of the zero extended data element using values from zero to the calculated most significant bit position concatenated with the number of calculated padding bits, and concatenate three zeros with the leading one position value and add 127 to calculate an exponent, store the sign, exponent, and fractional.

25. The apparatus of claim 23, wherein the size of the packed data elements of the identified packed data source is 32-bit, and the execution means is further to:

calculate an absolute value of the zero extended data element from the packed data element position of the identified packed data source operand, set a sign for the floating point representation to zero, determine a leading one position of the absolute value of the data element from the packed data element position of the identified packed data source operand, when the leading one position is null, set a fractional value to zero for floating point representation, when the leading one position is not null, subtract a 1 from the determined leading one position to set a most significant bit position, determine when the leading one position is greater than 23, when the leading one position is greater than 23, calculate a least significant bit position, and set a fractional as an absolute value of the data element using values from the calculated least significant bit position to the calculated most significant bit position, and when the leading one position is not greater than 23, calculate a number of padding bits, and set a fractional as an absolute value of the data element using values from zero to the calculated most significant bit position concatenated with the number of calculated padding bits, and concatenate three zeros with the leading one position value and add 127 to calculate an exponent, store the sign, exponent, and fractional.

* * * * *